(12) United States Patent
Choi

(10) Patent No.: US 11,044,429 B2
(45) Date of Patent: Jun. 22, 2021

(54) CHARGE COLLECTION GATE WITH CENTRAL COLLECTION PHOTODIODE IN TIME OF FLIGHT PIXEL

(71) Applicant: OmniVision Technologies, Inc., Santa Clara, CA (US)

(72) Inventor: Woon Il Choi, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/522,496

(22) Filed: Jul. 25, 2019

(65) Prior Publication Data

US 2021/0028209 A1 Jan. 28, 2021

(51) Int. Cl.
| | |
|---|---|
| H04N 5/369 | (2011.01) |
| H01L 27/146 | (2006.01) |
| H04N 5/378 | (2011.01) |
| G01J 1/44 | (2006.01) |
| G01S 17/36 | (2006.01) |
| G01S 17/89 | (2020.01) |
| H04N 5/353 | (2011.01) |

(52) U.S. Cl.
CPC ............ *H04N 5/36965* (2018.08); *G01J 1/44* (2013.01); *G01S 17/36* (2013.01); *G01S 17/89* (2013.01); *H01L 27/1464* (2013.01); *H01L 27/14614* (2013.01); *H04N 5/353* (2013.01); *H04N 5/378* (2013.01); *G01J 2001/446* (2013.01); *G06T 2207/10028* (2013.01)

(58) Field of Classification Search
CPC .... H04N 5/36965; H04N 5/378; H04N 5/353; H01L 27/14614; H01L 27/1464; G01J 1/44; G01J 2001/446; G01S 17/89; G01S 17/36; G06T 2207/10028
See application file for complete search history.

(56) References Cited

U.S. PATENT DOCUMENTS

| | | | |
|---|---|---|---|
| 8,314,924 B2 | 11/2012 | Bamji et al. | |
| 2004/0051802 A1* | 3/2004 | Krymski | H04N 5/361 348/308 |
| 2007/0158533 A1* | 7/2007 | Bamji | H04N 5/335 250/208.1 |
| 2009/0180010 A1* | 7/2009 | Adkisson | H04N 5/353 348/294 |

(Continued)

OTHER PUBLICATIONS

C. Bamji et al., "A 0.13 um CMOS System-on-Chip for a 512×424 Time-of-Flight Image Sensor With Multi-Frequency Photo-Demodulation up to 130 MHz and 2 GS/s ADC," IEEE Journal of Solid-State Circuits, vol. 50, No. 1, Jan. 2015, 17 pages.

*Primary Examiner* — Albert H Cutler
(74) *Attorney, Agent, or Firm* — Christensen O'Connor Johnson Kindness PLLC

(57) ABSTRACT

A pixel circuit includes a photodiode disposed in a semiconductor material layer to accumulate image charge in response to light incident upon the photodiode. A charge collection gate is coupled to the photodiode. The charge collection gate is disposed over the photodiode to generate an inversion layer in the semiconductor material layer under the charge collection gate to collect the image charge from the photodiode. A first transfer gate is disposed proximate to the charge collection gate, wherein the first transfer gate is coupled to transfer the image charge from in the inversion layer in response to a first transfer signal.

59 Claims, 10 Drawing Sheets

(56) References Cited

U.S. PATENT DOCUMENTS

| | | | |
|---|---|---|---|
| 2012/0018619 A1* | 1/2012 | Roy | H01L 27/1464 |
| | | | 250/208.1 |
| 2014/0124839 A1* | 5/2014 | De Wit | H04N 5/3592 |
| | | | 257/222 |
| 2016/0307947 A1* | 10/2016 | Dierickx | H01L 27/14614 |
| 2016/0343751 A1* | 11/2016 | Sze | H01L 27/14656 |
| 2017/0214878 A1* | 7/2017 | Van Der Tempel | |
| | | | H04N 5/3559 |
| 2018/0026147 A1* | 1/2018 | Zhang | H01L 31/022416 |
| | | | 257/292 |
| 2018/0213205 A1* | 7/2018 | Oh | H01L 27/14636 |
| 2018/0308889 A1* | 10/2018 | Takagi | H04N 5/369 |
| 2019/0208150 A1* | 7/2019 | Jin | H04N 5/351 |
| 2020/0203416 A1* | 6/2020 | Jin | H01L 27/1464 |

\* cited by examiner

CHARGE COLLECTION GATE WITH CENTRAL COLLECTION PHOTODIODE IN TIME OF FLIGHT PIXEL

BACKGROUND INFORMATION

Field of the Disclosure

This disclosure relates generally to semiconductor devices, and in particular but not exclusively, relates to time of flight image sensors.

Background

Interest in three dimensional (3D) cameras is increasing as the popularity of 3D applications continues to grow in areas such as imaging, movies, games, computers, user interfaces, facial recognition, object recognition, augmented reality, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the 3D images. In addition, this technique is complex and therefore requires significant computer processing power in order to create the 3D images in real time.

For applications that require the acquisition of 3D images in real time, active depth imaging systems based on time of flight measurements are sometimes utilized. Time of flight cameras typically employ a light source that directs light at an object, a sensor that detects the light that is reflected from the object, and a processing unit that calculates the distance to the object based on the round-trip time it takes for the light to travel to and from the object.

A continuing challenge with the acquisition of 3D images is balancing the desired performance parameters of the time of flight camera with the physical size and power constraints of the system. For example, the power requirements of high-performance time of flight systems are considerably high as time of flight cameras typically operate at very high frequencies and require very fast charge transfer times. These challenges are further complicated by both extrinsic parameters (e.g., desired frame rate of the camera, depth resolution, and lateral resolution) as well as intrinsic parameters (e.g., quantum efficiency of the sensor, fill factor, jitter, and noise).

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
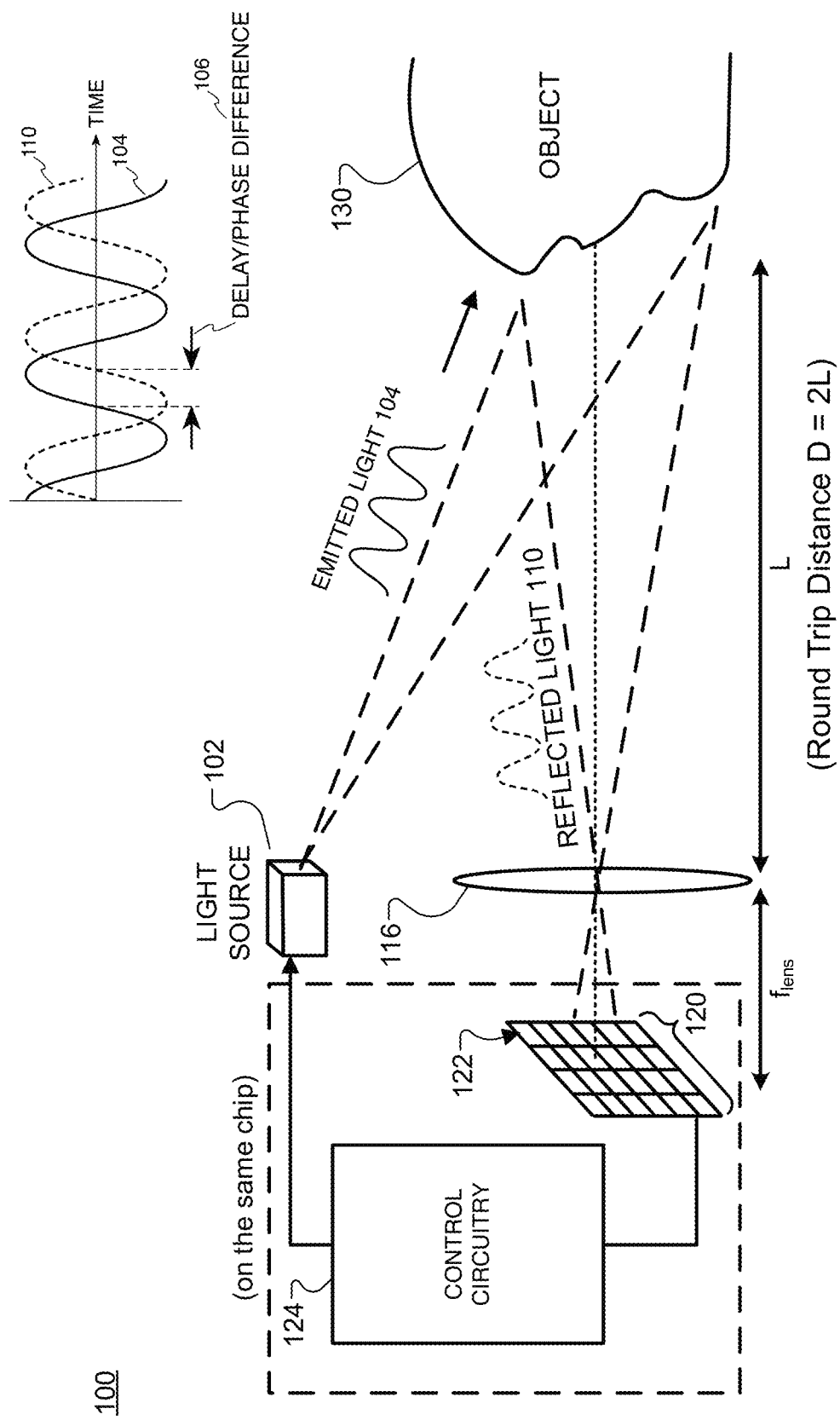
FIG. 1 is a block diagram that shows one example of a time of flight light sensing system including an example charge collection gate with a central collection photodiode in time of flight pixels in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to an example charge collection gate with central collection photodiodes in time of flight pixel structures and corresponding circuitry are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, in the various embodiments of this disclosure, a time of flight light sensing system or image sensor having reduced power consumption and improved charge transfer speeds for each individual pixel without increased pixel sizes compared to known photogate indirect time of flight (iTOF) pixel structures are disclosed. For example, one known type of photogate iTOF pixel structure uses large long finger photogates, and toggles between activating the photogates to perform potential modulation to generate a potential gradient to fully deplete the low doped silicon substrate during integration. Generally, for higher accuracy the known iTOF pixel structure is operated at a high modulated frequency (e.g., 30 MHz-100 MHz). This type of large long photogate generates high capacitance during operation, thereby suffers from a high power consumption requirement (e.g., ~1.2 W), especially at high frequency.

Another known photogate iTOF pixel structure uses high alternating current toggling through two photogates that are located at a large distance from each other. Since the high alternating current is required to flow through a silicon substrate of high resistivity, which consequently causes a large IR drop, this iTOF pixel structure also suffers from high power consumption. Furthermore, the power consumed increases significantly at higher operating frequencies. Moreover, the image charge transfer paths in these types of known iTOF pixel structures also are long, which increase the response time of the iTOF pixel structure.

In addition, photogates of known iTOF pixel structures require large pixel areas, thus having a negative impact on fill factor and pixel miniaturization. Furthermore, photogates of known iTOF pixel structures occupy certain space per unit pixel, which reduces the size of photodiodes and limits the full well capacity (FWC) of photodiode the pixel.

FIG. 1 is a block diagram that shows one example of a time of flight light sensing system 100, in accordance with the teachings of the present disclosure. Time of flight light sensing system 100 includes light source 102, lens 116, image sensor 120 (including a plurality of pixels such as first pixel 122), and control circuitry 124. As will be discussed in greater detail below, the plurality of pixels included in image sensor 120 include example charge collection gates with central collection photodiodes in time of flight pixels to perform indirect time of flight (iTOF) measurements in accordance with the teachings of the present invention. Control circuitry 124 is coupled to light source 102 and image sensor 120. Image sensor 120 is positioned at a focal length $f_{lens}$ from lens 116.

As shown in the example, light source 102 and lens 116 are positioned at a distance L from object 130. It is appreciated that FIG. 1 is not illustrated to scale and that in one example the focal length $f_{lens}$ is substantially less than the distance L between lens 116 and object 130. Therefore, it is appreciated that for the purposes of this disclosure, the distance L and the distance L+focal length $f_{lens}$ are substantially equal for the purposes of time of flight measurements in accordance with the teachings of the present invention. As illustrated, image sensor 120 and control circuitry 124 are represented as separate components. However, in one example, it is appreciated that image sensor 120 and control circuitry 124 may all be integrated onto a same stacked chip sensor. In other examples, image sensor 120 and control circuitry 124 may be integrated onto a non-stacked standard planar sensor. Furthermore, it is appreciated that control circuitry 124 may include one or more of time-to-digital converters. In some examples, each pixel may include one or more avalanche photodiodes (e.g., single-photon avalanche diode) that may be associated with a corresponding one of one or more time-to-digital converters. It is also appreciated, that in some examples, individual time-to-digital converters may be associated with any pre-determined number of pixels. Furthermore, it is appreciated that each pixel may have a corresponding memory for storing digital bits or signals for counting detected photons from the avalanche photodiode.

In the depicted example, time of flight light sensing system 100 is a 3D camera that calculates image depth information of a scene to be imaged (e.g., object 130) based on indirect time of flight (iTOF) measurements with image sensor 120. In some examples, it is appreciated that although time of flight light sensing system 100 is capable of sensing 3D images, time of flight light sensing system may also be utilized to capture 2D images. In various examples, time of flight light sensing system may also be utilized to capture high dynamic range (HDR) images.

Continuing with the depicted example, each pixel of the plurality of pixels in the image sensor 120 determines depth information for a corresponding portion of object 130 such that a 3D image of object 130 can be generated. In the depicted example depth information is determined by measuring the delay/phase difference 106 between emitted light 104 and the received reflected light 110 to indirectly determine a round-trip time for light to propagate from light source 102 to object 130 and back to time of flight light sensing system 100. The depth information may be based on an electric signal generated by the image sensor 120 (e.g., the first pixel 122) that is subsequently transferred to a storage node.

As illustrated, light source 102 (e.g., a light emitting diode, a vertical-cavity surface-emitting laser, or the like) is configured to emit light 104 (e.g., emitted light waves) to the object 130 over a distance L. The emitted light 104 is then reflected from the object 130 as reflected light 110 (e.g., reflected light waves), some of which propagates towards the time of flight light sensing system 100 over the distance L and is incident upon the image sensor 120 as image light. Each pixel (e.g., the first pixel 122) of the plurality of pixels included in the image sensor 120 includes a photodetector (e.g., one or more photodiodes, avalanche photodiodes, or single-photon avalanche diodes) to detect the image light and convert the image light into an electric signal (e.g., signal electrons, image charge, etc.).

As shown in the depicted example, the round-trip time for the light waves of the emitted light 104 to propagate from light source 102 to object 130 and then be reflected back to image sensor 120 can be used to determine the distance L using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ corresponds to the round-trip time which is the amount of time that it takes for the light to travel to and from the object as shown in FIG. 1. Accordingly, once the round-trip time is known, the distance L may be calculated and subsequently used to determine depth information of object 130.

Control circuitry 124 is coupled to image sensor 120 (including first pixel 122) and light source 102, and includes logics and memory that when executed causes time of flight light sensing system 100 to perform operations for determining the round-trip time. Determining the round-trip time may be based on, at least in part, timing signals generated by control circuitry 124. For indirect time of flight (iTOF) measurements, the timing signals are representative of the delay/phase difference 106 between the light waves of when the light source 102 emits light 104 and when the photodetector detects the reflected light 110.

In some examples, time of flight light sensing system 100 is included in a handheld device (e.g., a mobile phone, a tablet, a camera, etc.) that has size and power constraints determined, at least in part, based on the size of the device. Alternatively, or in addition, time of flight light sensing system 100 may have specific desired device parameters such as frame rate, depth resolution, lateral resolution, etc.

Figure 2:
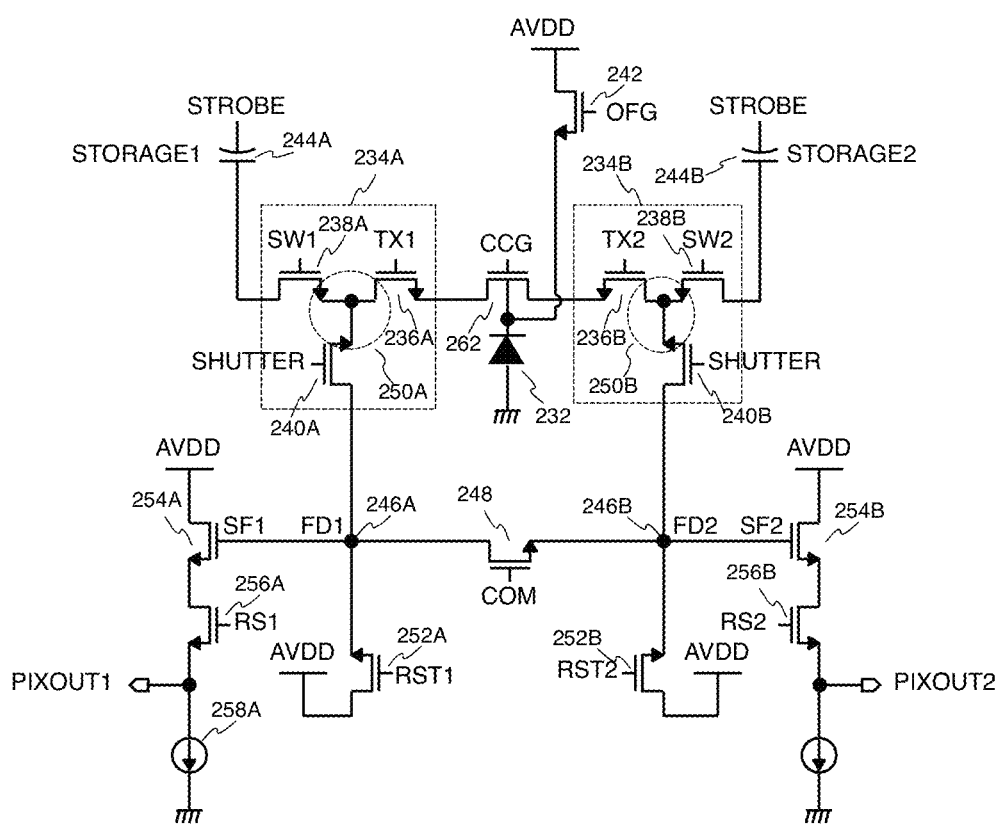
FIG. 2 is a schematic that shows one example of a time of flight light pixel circuit including example an example charge collection gate with a central collection photodiode in accordance with the teachings of the present disclosure.

FIG. 2 is a schematic that shows one example of a time of flight light pixel circuit 222 including an example charge collection gate with a central collection photodiode in accordance with the teachings of the present disclosure. It is appreciated pixel circuit 222 of FIG. 2 may be an example of a pixel 122 of the image sensor 120 as shown in FIG. 1, and that similarly named and numbered elements described above are coupled and function similarly below. As shown in FIG. 2, pixel circuit 222 includes a photodiode 232, which is configured to accumulate image charge in response to light that is incident upon the photodiode 232. As will discussed in greater detail below, in one example, photodiode 232 is a central collecting photodiode disposed in semiconductor material layer with a doping profile that creates a potential profile that pushes photo-generated image charge carriers to the surface of the semiconductor material towards the center of the photodiode 232 beneath a charge collection gate 262 that is coupled to the photodiode 232. As will be discussed in greater detail below, the charge collection gate 262 is coupled and constantly biased (by a charge collection signal CCG) to generate an inversion layer in the semiconductor material layer under the charge collection gate 262 with image charge collected from the photodiode.

In the illustrated example, a tri-gate charge transfer block 234A and a tri-gate charge transfer block 234B are coupled to the charge collection gate 262 to transfer the collected photo-generated image charge carriers from the inversion layer of charge collection gate 262 with low power consumption and at improved charge transfer speeds in accordance with the teachings of the present invention. As shown in the depicted example, tri-gate charge transfer block 234A is also coupled to a floating diffusion 246A and a charge storage structure 244A. Similarly, tri-gate charge transfer block 234B is also coupled to a floating diffusion 246B and a charge storage structure 244B. In the depicted example, charge storage structures 244A and 244B are capacitors coupled to receive a strobe signal. As will be discussed, in one example, the strobe signals can be configured to pulsed between first and second values to spill over charges stored in the charge storage structures 244A and 244B through the tri-gate charge transfer blocks 234A and/or 234B to floating diffusions 246A and 246B as an alternate way to transfer the charges for readout in accordance with the teachings of the present invention Tri-gate charge transfer block 234A includes a transfer gate 236A coupled to charge collection gate 262, a shutter gate 240A coupled to floating diffusion 246A, and a switch gate 238A coupled to charge storage structure 244A. FIG. 2 shows transfer gate 236A having a source coupled to charge collection gate 262, shutter gate 240A having a drain coupled to floating diffusion 246A, and switch gate 238A having a drain coupled to charge storage structure 244A. Transfer gate 236A, shutter gate 240A, and switch gate 238A are electrically coupled. Transfer gate 236A, shutter gate 240A, and switch gate 238A are all disposed proximate to and share a single shared channel region 250A in the semiconductor material (as indicated with the dashed circle labeled 250A in FIG. 2.) Thus, the single shared channel region 250A of tri-gate charge transfer block 234A is a common extended channel region of transistor gate 236A, shutter gate 240A, and switch gate 238A. Restated, transfer gate 236A, shutter gate 240A, and switch gate 238A share a single region. It can be appreciated that there may be no junction or source/drain doping between transfer gate 236A, shutter gate 240A and switch gate 238A. In one embodiment, single share channel region 250A shared among transfer gate 236A, shutter gate 240A and switch gate 238A may be an un-doped region. In another embodiment, the single shared region shared among transfer gate 236A, shutter gate 240A and switch gate 238A may be a doped region. The conduction of single shared channel region 250A can be modulated or determined by the coupling combined biasing potential of transfer gate 236A, shutter gate 240A, and switch gate 238A.

As such, image charge that is in the single shared channel region 250A is simultaneously in the drain of transistor gate 236A, in the source of shutter gate 240A, and in the source of switch gate 238A. As a result, transfer speeds of image charge through tri-gate charge transfer block 234A are improved because the distances of the image charge paths through tri-gate charge transfer block 234A are very short in accordance with the teachings of the present invention.

In operation, the transfer gate 236A is configured to transfer the image charge collected by charge collection gate 262 to the single shared channel region 250A in response to a transfer signal TX1, the shutter gate 240A is configured to transfer the image charge in the single shared channel region 250A to a floating diffusion 246A in response to a shutter signal SHUTTER, and the switch gate 238A is configured to couple the single shared channel region 250A to the charge storage structure 244A in response to a switch signal SW1.

In one example, during an exemplary integration operation, where transfer gate 236A and shutter gate 240A are biased to be on while the switch gate 238A is off, the potential barrier for the conduction channel formed in between the transfer gate 236A and the shutter gate 240A is lowered for the electrons to transfer or tunnel through. At the same time, the potential barrier for the conduction channel formed between transfer gate 236A and switch gate 238A and between shutter gate 240A and switch gate 238A is high, such that charges are only transferred from transfer gate 236A to floating diffusion 246A through the conducting channel formed between the transfer gate 236A and shutter gate 240A and no charge is flowing to switch gate 238A. It is appreciated by those skilled in the arts that the transfer operation of the single shared channel region can be controlled by modulating the biasing potential applied to transfer gate 236A, switch gate 238A, and shutter gate 240A.

Tri-gate charge transfer block 234B shares many similarities with tri-gate charge transfer block 234A. As shown, tri-gate charge transfer block 234B includes a transfer gate 236B coupled to charge collection gate 262, a shutter gate 240B coupled to floating diffusion 246B, and a switch gate 238B coupled to charge storage structure 244B. Transfer gate 236B includes a source coupled to charge collection gate 262, shutter gate 240B includes a drain coupled to floating diffusion 246B, and switch gate 238B includes a drain coupled to charge storage structure 244B. Transfer gate 236B, shutter gate 240B, and switch gate 238B are electrically coupled and are all disposed proximate to and share a single doped region 250B in the semiconductor material layer (as indicated with the dashed circle labeled 250B in FIG. 2.) Thus, the single shared channel region 250B of tri-gate charge transfer block 234B is a single shared channel region 250B shared among transistor gate 236B, shutter gate 240B, and switch gate 238B. Similarly, the conduction of single shared channel region 250B is modulated or determined by the coupling combined biasing potential of transfer gate 236B, shutter gate 240B, and switch gate 238B. As such, image charge that is in the single shared channel region 250B is simultaneously in the drain of transistor gate 236B, in the source of shutter gate 240B, and in the source switch gate 238B.

In operation, the transfer gate 236B is configured to transfer the image charge collected by charge collection gate 262 to the single shared channel region 250B in response to a transfer signal TX2, the shutter gate 240B is configured to transfer the image charge in the single shared channel region 250B to a floating diffusion 246B in response to a shutter signal SHUTTER, and the switch gate 238B is configured to couple the single shared channel region 250B to the charge storage structure 244A in response to a switch signal SW2.

The example illustrated in FIG. 2 shows that pixel circuit 222 also includes a reset transistor 252A coupled between a voltage supply AVDD (e.g., 2.8V~3.3V) and floating diffusion 246A. Reset transistor 252A is coupled to reset the floating diffusion 246A in response to a reset signal RST1. A source follower transistor 254A is coupled to the floating diffusion 246A, and is coupled to generate a pixel output signal PIXOUT1 in response to the image charge in the floating diffusion 246A. A row select transistor 256A is coupled to the source follower transistor 254A and current source 258A as shown. In operation, row select transistor 256A is coupled to output the pixel output signal PIXOUT1 from the source follower transistor 254A in response to a row select signal RS1.

Similarly, the example illustrated in FIG. 2 shows that pixel circuit 222 also includes a reset transistor 252B coupled between voltage supply AVDD and floating diffusion 246B. Reset transistor 252B is coupled to reset the floating diffusion 246B in response to a reset signal RST2. A source follower transistor 254B is coupled to the floating diffusion 246B, and is coupled to generate a pixel output signal PIXOUT2 in response to the image charge in the floating diffusion 246B. A row select transistor 256B is coupled to the source follower transistor 254B and current source 258B as shown. In operation, row select transistor 256B is coupled to output the pixel output signal PIXOUT2 from the source follower transistor 254B in response to a row select signal RS2.

In one example, pixel circuit 222 also includes an overflow transistor 242 coupled between a voltage supply AVDD and the photodiode 232. In operation, the overflow transistor 242 is configured to drain excess image charge from the photodiode 232 in response to an overflow signal OFG. As such, it is appreciated that overflow transistor 242 can help improve performance of the pixel circuit 222 in bright sunny outdoor conditions because image charge generated by background ambient light can be drained through the overflow transistor 242 during readout operations. For example, after an integration period, the pixel circuit 222 begins a readout period to read out the charges from storage. However, during the readout period, light is still incident on photodiode 232, which can interfere with image charge readings. As such, the overflow transistor 242 can be turned on during the readout period to drain these charges into the overflow transistor 242 drain node.

In one example, pixel circuit 222 also includes a common mode transistor 248 coupled between floating diffusion 246A and floating diffusion 246B. In operation, the common mode transistor 248 is configured to reset a common mode level between floating diffusion 246A and floating diffusion 246B in response to a common mode reset signal COM to help to reduce noise in pixel circuit 222. In particular, it is appreciated that there can be many factors that can cause a potential difference between floating diffusion 246A and floating diffusion 246B, such as for example process variations, transistor mismatches, offset variations, etc. In order to help cancel the noise that can result from a potential difference or offset between floating diffusion 246A and floating diffusion 246B, a common mode level can be provided by enabling and disabling (e.g., turning on and turning off) common mode transistor 248 shortly after sampling signals from floating diffusion 246A and floating diffusion 246B.

In operation, pixel circuit 222 may be reset to pre-charge the elements of pixel circuit 222 to initialized values before the integration period begins. In one example, during the initial pre-charge or reset period, the overflow gate 242, transfer gates 236A and 236B, reset transistors 252A and 252B, switch gates 238A and 238B, and shutter gates 240A and 240B are all enabled to pre-charge or reset the charge in photodiode 232, charge storage structures 244A and 244B, and floating diffusions 246A and 246B to initialized values. It is appreciated by those skilled in the arts that initial reset values may be configured based on the supplied voltage (e.g., voltage supply AVDD) and the power consumption requirements for pixel circuit 222.

Afterwards, the integration period may begin so that image charge is photo-generated in photodiode 232 in response to light (e.g., reflected light 110 from object 130 of FIG. 1) that illuminates photodiode 232. The accumulated image charge photo-generated in photodiode 232 is collected by charge collection gate 262 in an inversion layer in the semiconductor material. The image charge collected by the charge collection gate 262 is transferred from the inversion layer to single shared channel region 250A of tri-gate charge transfer block 234A by transfer gate 236A in response to transfer signal TX1. In addition, the image charge collected by the charge collection gate 262 may also be transferred to single shared channel region 250B of tri-gate charge transfer block 234B by transfer gate 236B in response to transfer signal TX2. The image charge in single shared channel region 250A and in single shared channel region 250B may then be transferred to floating diffusion 246A and floating diffusion 246B by shutter gate 240A and shutter gate 240B, respectively, in response to respective SHUTTER signals.

Transfer gates 236A and 236B are toggled to switch on and off to collect the image charge collected by the charge collection gate 262 from photodiode 232. In one example, the transfer signal TX1 and the transfer signal TX2 are pulse signals configured to have different phases driving the transfer gate 236A and the transfer gate 236B with different delays during the integration period to measure the phase shift information of incident light (e.g., reflected light 110 in FIG. 1) so as to determine the distance between an object (e.g., the object 130) and the pixel 222 circuit of the image sensor. In one example, the driving voltage (e.g., the signal level of transfer signal TX1 and TX2) for the transfer gate 236A and the transfer gate 236B may be ranged between 1.0V-2.0V.

In various examples, the full well capacity (FWC) of pixel circuit 222 may also be adjusted in by switch gates 238A and 238B in response to respective switch signals SW1 and SW2 to adjust the conversion gain of pixel circuit 222 to accommodate lighting conditions. For instance, by enabling switch gates 238A and 238B during the integration period, image charge may be stored in charge storage structures 244A and 244B as well as floating diffusions 246A and 246B, which increases the FWC to reduce the conversion gain of pixel circuit 222 for bright outdoor conditions. In the alternative, by disabling switch gates 238A and 238B, image charge is not stored in charge storage structures 244A and 244B, which decreases the FWC to increase the conversion gain of pixel circuit 222 for dimmer indoor conditions. Therefore, it is appreciated that pixel circuit 222 may be suitable for both indoor or outdoor conditions to sense high dynamic range (HDR) image data in response to switch signals SW1 and SW2 in accordance with the teachings of the present invention.

The image charge in floating diffusion 246A is converted to a pixel output signal PIXOUT1 by source follower transistor 254A and the image charge in floating diffusion 246B is converted to a pixel output signal PIXOUT2 by source follower transistor 254B. During the readout period of pixel circuit 222, the pixel output signal PIXOUT1 may be read out by enabling the row select transistor 256A in response to a row select signal RS1, and/or the pixel output signal PIXOUT2 may be read out by enabling the row select transistor 256B in response to a row select signal RS2.

In exemplary operation, normalized output pixel values may also be provided with pixel 222 by generating correlated double sampling (CDS) pixel outputs for PIXOUT1 and PIXOUT2 with a sampled reset signal. To this end, the CDS pixel output values for PIXOUT1 and PIXOUT2 may be determined by measuring the charge in the floating diffusions 246A and 246B twice and then determining the difference between each of the two image charge measurements and the sampled reset signal to cancel out noise, such as for example kTC noise, or the like. One of the measurements is sampled after a reset of the floating diffusions 246A and 246B in response to enabling the reset transistors 252A and 252B in response to reset signals RST1 and RST2, respectively. The other measurement is sampled after transferring the image charge accumulated in photodiode 232 to floating diffusions 246a and 246B through transfer gates 236A and 236B in response to transfer signals TX1 and TX2, and through shutter gates 240A and 240B in response to respective SHUTTER signals. In various example, the reset readings from floating diffusions 246A and 246B may be sampled before or after the sampling of the signal values from floating diffusions 246A and 246B in accordance with the teachings of the present invention.

Figure 3:
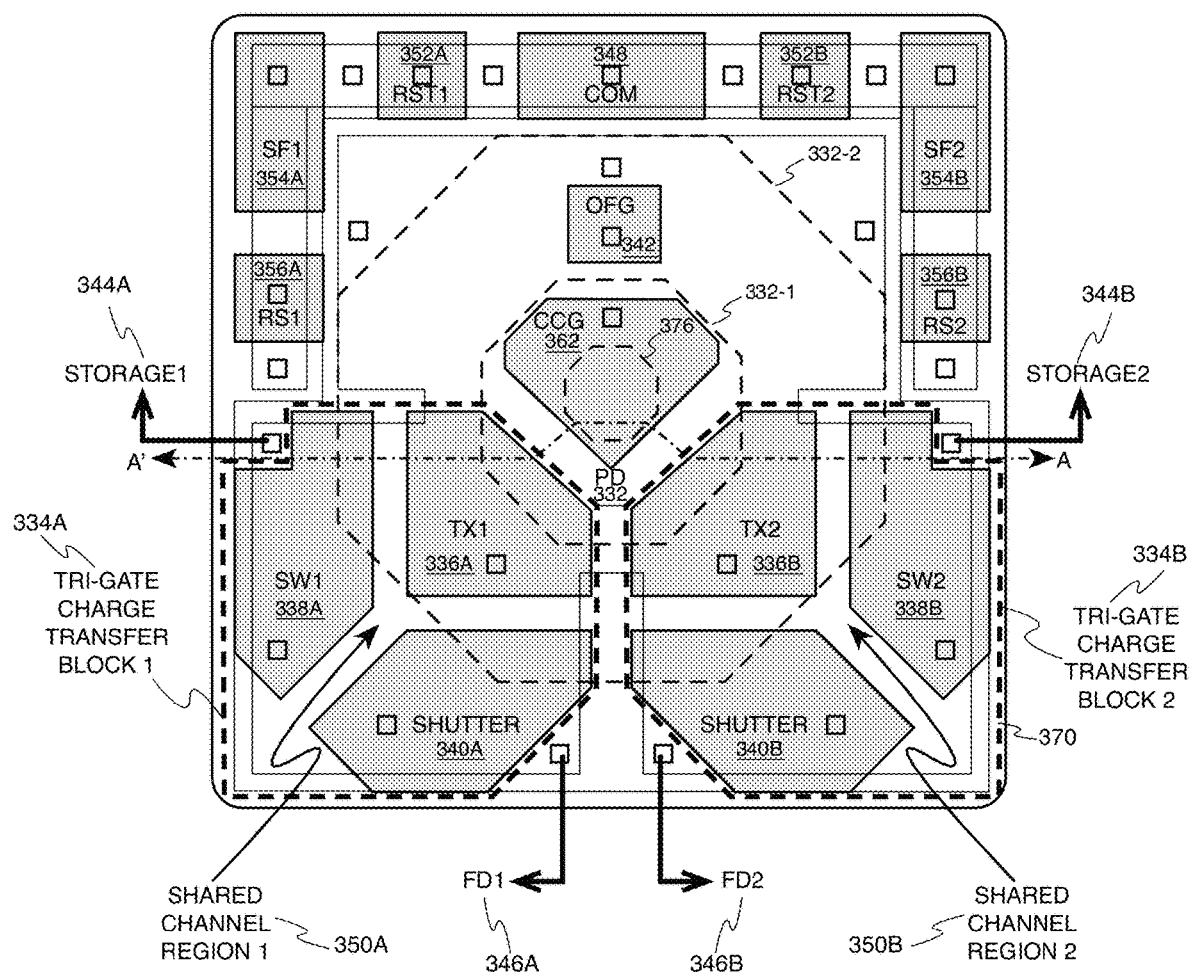
FIG. 3 is a top down view of one example a time of flight light pixel circuit in semiconductor material including an example charge collection gate with a central collection photodiode in accordance with the teachings of the present disclosure.

FIG. 3 is a top down view or plan view of one example a time of flight light pixel circuit 322 in semiconductor material including an example charge collection gate with an example central collection photodiode in accordance with the teachings of the present disclosure. It is appreciated pixel circuit 322 of FIG. 3 may be an example of pixel circuit 222 of FIG. 2, and/or of a pixel 122 of the image sensor 120 as shown in FIG. 1, and that similarly named and numbered elements described above are coupled and function similarly below. As shown in FIG. 3, pixel circuit 322 includes a photodiode 332 disposed in a semiconductor material layer 370 to accumulate image charge in response to light incident upon the photodiode 332. A charge collection gate 362 is disposed over the photodiode 332 in semiconductor material layer 370. In the example, the charge collection gate 362 is coupled to the photodiode 332 to generate an inversion layer 376 in the semiconductor material layer 370 under the charge collection gate 362 to collect the image charge from the photodiode 332 in accordance with the teachings of the present invention.

As shown in the depicted example, a tri-gate charge transfer block 334A is coupled to the charge collection gate 362 to transfer the image charge collected in the inversion layer 376 of the charge collection gate 362. The tri-gate charge transfer block 334A includes a single shared channel region 350A disposed in the semiconductor material layer 370. In the example, the single shared channel region 350A is a single shared channel region that is shared by transfer gate 336A, shutter gate 340A, and switch gate 338A. As such, the transfer gate 336A is disposed proximate to the single shared channel region 350A, and the transfer gate 336A is configured to transfer the image charge from the inversion layer 376 of the charge collection gate 362 to the single shared channel region 350A in response to a transfer signal TX1. The shutter gate 340A is disposed proximate to the single shared channel region 350A, and the shutter gate 340A is configured to transfer the image charge in the single shared channel region 350A to a floating diffusion 346A disposed in the semiconductor material layer 370 in response to a shutter signal SHUTTER. The switch gate 338A is disposed proximate to the single shared channel region 350A, and the switch gate 338A is configured to couple the single shared channel region 350A to a charge storage structure 344A disposed in the semiconductor material layer 370 in response to a switch signal SW1.

As shown in the illustrated example, pixel circuit 322 also includes tri-gate charge transfer block 334B, which is coupled to the charge transfer gate 362. It is appreciated that tri-gate charge transfer block 334B is similar to tri-gate charge transfer block 334A as tri-gate charge transfer block 334B includes a single shared channel region 350B disposed in the semiconductor material layer 370. Transfer gate 336B, shutter gate 340B, and switch gate 338B are disposed proximate to single shared channel region 350B. Transfer gate 336B is configured to transfer the image charge collected in the inversion layer 376 of the charge collection gate 362 to the single shared channel region 350B in response to a transfer signal TX2. Shutter gate 340B is configured to transfer the image charge in the single shared channel region 350B to a floating diffusion 346B disposed in the semiconductor material layer 370 in response to shutter signal SHUTTER. The switch gate 338B is configured to couple the single shared channel region 350B to a charge storage structure 344B disposed in the semiconductor material layer 370 in response to a switch signal SW2.

The example illustrated in FIG. 3 also illustrates the row select gates 356A and 356B, the source follower gates 354A and 354B, reset gates 352A and 352B, and common mode gate 348 of pixel circuit 322 arranged over semiconductor material layer 370 around the photodiode 332. In addition, the overflow gate 342 is also disposed over the semiconductor material layer 370 and is coupled to the photodiode 332 to drain the excess image charges from the photodiode 332 in response to an overflow signal OFG. In the depicted example, it is appreciated that the overflow gate 342 is disposed a sufficient distance from the charge collecting point of inversion layer 376 so as to prevent unwanted image charge loss.

In one exemplary operation, the charge storage structures are used to enhance the full well capacity, for example, for an outdoor image application. During the integration, switch gates 338A, 338B are turned on with switch signals SW1, SW2, respectively while transfer gates 336A and 336B are pulsed to turn on alternatively with transfer signals TX1, TX2. When transfer gate 336A is pulsed on while transfer gate 336B is pulsed off, the photo-generated image charges collected in the inversion layer 376 of the charge collection gate 362 are transferred to the charge storage structure 344A through the single shared channel region 350A formed between transfer gate 336A and switch gate 338A. When transfer gate 336B is pulsed on while transfer gate 336A is pulsed off, the photo-generated image charges collected in the inversion layer 376 of the charge collection gate 362 are transfer to charge storage structure 344B through the single shared channel region 350B formed between transfer gate 336B and switch gate 338B. At the end of integration, overflow gate 342 turns on in response to overflow signal OFG to drain excess image charges from photodiode 332. During read out, transfer gates 336A and 336B are turned off while switch gates 338A, 338B and shutter gates 340A, 340B are turned on to facilitate image charge transfer to floating diffusions 346A, 346B. Image charges stored in the charge storage structure 344A are transferred to floating diffusion 346A through the single shared channel region 350A between the switch gate 338A and shutter gate 340A. Image charges stored in charge storage structure 344B are transferred to floating diffusion 346B through single shared channel region 350B between switch gate 338B and shutter gate 340B.

In one exemplary application for small full well capacity with high conversion gain, for example, for an indoor imaging application, only floating diffusions are used for storing charges. During the integration, switch gates 338A, 338B are turned off while shutter gates 340A, 340B are turned on with the shutter signal SHUTTER while transfer gates 336A, 336B are pulsed to turn on alternatively with transfer signals TX1, TX2. When the transfer gate 336A is pulsed on while transfer gate 336B is pulsed off, the photo-generated images charges collected are transferred from the inversion layer 376 of the charge collection gate 362 to floating diffusion 346A through single shared channel region 350A formed between transfer gate 336A and shutter gate 340A. When transfer gate 336B is pulsed on while transfer gate 336A is pulsed off, the photo-generated image charges collected are transferred from the inversion layer 376 of the charge collection gate 362 to floating diffusion 346B through the single shared channel region 350B formed between transfer gate 336B and the shutter gate 340B. At the end of integration, overflow gate 342 turns on in response to the overflow signal OFG to drain excess image charges from photodiode 332. During read out, image charges stored in floating diffusions 346A and 346B are read out, respectively.

As shown in the depicted example and as will be described in further detail below, it is appreciated that photodiode 332 is a central collecting photodiode disposed in semiconductor material layer 370 with a doping profile that creates a potential profile that pushes photo-generated image charge carriers to the surface of the semiconductor material layer 370 towards the center of the photodiode 332. For instance, in the depicted example and as will be described in further detail below, photodiode 332 is illuminated through a backside surface of semiconductor material layer 370. Image charge is photo-generated in photodiode 332, and the doping profile and structure of photodiode 332 pushes the image charge accumulated in photodiode 332 towards a front side surface of semiconductor material layer 370 and towards the center of photodiode 332 near the front side surface of semiconductor material layer 370, which is below the charge collection gate 362. In one example, the cross sectional area of the doped region of photodiode 332 closest to the backside surface of semiconductor material layer 370 is a wider cross sectional area, which is illustrated with dashed line 332-2 in FIG. 3. In the example, the cross sectional area of the doped region of photodiode 332 closest to the front side surface of semiconductor material layer 370 is a narrower cross sectional area, which is illustrated with dashed line 332-1 in FIG. 3. The charge collection gate 362 is charge collection gate is coupled to be biased with a constant bias voltage (e.g., charge collection signal CCG) to collect the image charge from the photodiode 332 into the inversion layer 376, which is coupled to the transfer gates 336A and 336B of tri-gate charge transfer block 234A, 234B, respectively.

Figure 4:
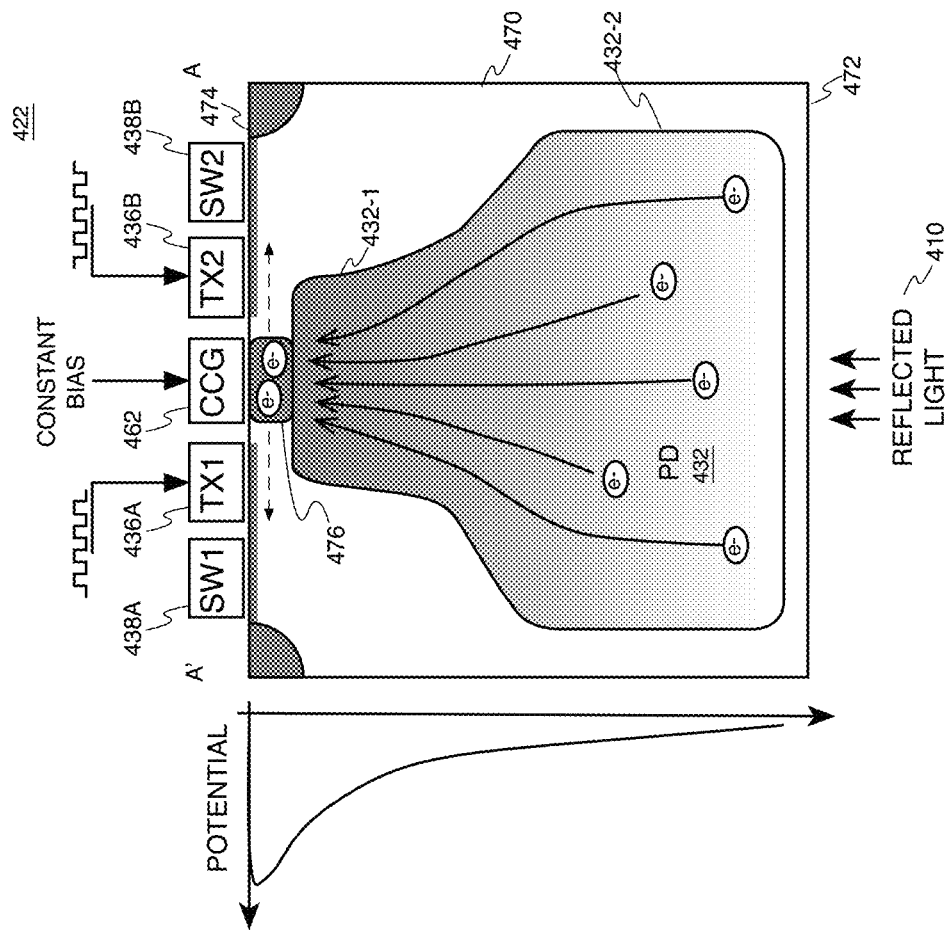
FIG. 4 is a cross section view of one example a time of flight light pixel circuit including an example charge collection gate with a central collection photodiode in semiconductor material in accordance with the teachings of the present disclosure.

To illustrate, FIG. 4 is a cross section view of one example a pixel circuit 422 including an example charge collection gate 462 with a central collection photodiode 432 in semiconductor material layer 470 in accordance with the teachings of the present disclosure. It is appreciated pixel circuit 422 of FIG. 4 may be a cross section view example of pixel circuit 322 along dashed line A'-A of FIG. 3, and/or pixel 222 of FIG. 2, and/or of a pixel 122 of the image sensor 120 as shown in FIG. 1, and that similarly named and numbered elements described above are coupled and function similarly below. As shown in FIG. 4, pixel circuit 422 includes a photodiode 432 disposed in a semiconductor material layer 470. Charge collection gate 462, transfer gates 436A and 436B, and switch gates 438A and 438B are arranged along the front side surface 474 surface of semiconductor material layer 470 as shown. In one example, charge collection gate 462, transfer gates 436A and 436B, and switch gates 438A and 438B are formed with polysilicon, and the semiconductor material layer 470 is formed from a p-type epitaxial silicon wafer. In one example, the semiconductor material 470 includes a p-type epitaxial silicon layer (or a p-type semiconductor substrate layer), and photodiode 432 includes n-type dopants that are implanted into the p-type epitaxial silicon layer of semiconductor material layer 470. In other examples, it appreciated of course the polarities of the dopants may be switched such that photodiode 432 may be formed from p-type dopants that are implanted into an n-type epitaxial silicon layer of the semiconductor material 470.

In the illustrated example, the cross sectional area of the portion 432-2 of photodiode 432 that is closer to the backside surface 472 of semiconductor material layer 470 is a wider cross sectional area, and the cross sectional area of the portion 432-1 of photodiode 432 that is closer to the front side surface 474 of semiconductor material layer 470 is a narrower cross sectional area. In one example, during fabrication, the photodiode 432 is implanted in the semiconductor material layer 470 with a deep n-type photodiode implant with a wider open n-type photodiode mask, and a middle/shallow n-type photodiode implant is performed with a smaller or narrower open n-type photodiode mask.

The example depicted in FIG. 4 also shows that photodiode 432 has a gradient doping profile. For instance, in one example, the doping profile of the doped region of photodiode 432 has a doping concentration of approximately 1E12 atoms per cubic centimeter (atoms/cm$^3$) at the portion 432-2 of photodiode 432 that is closest to the backside surface 472 of semiconductor material layer 470, which increases gradually to approximately 1E15 atoms/cm$^3$ at a middle portion of photodiode 432 between the backside surface 472 and front side surface 474 of semiconductor material layer 470. In the example, the doping concentration continues to increase gradually to 1E16 atoms/cm$^3$ at the front side surface 474 surface of semiconductor material layer 470 beneath the charge collection gate 476 as shown.

As shown in the depicted example, the potential in the photodiode 432 therefore increases gradually from the backside surface 472 to the front side surface 474 of semiconductor material layer 470. It is appreciated that the specific doping concentrations provided herewith are for explanation purposes, and that in other examples, different specific doping concentrations may also be contemplated in accordance with the teachings of the present invention.

During operation, light 410 (e.g., light that is reflected from object 130 in FIG. 1) is directed through the backside surface 472 of semiconductor material layer 470 and into photodiode 432. Image charge carriers, which are illustrated as electrons "e-" in FIG. 4, are photo-generated in photodiode 432 in response to the incident reflected light 410. In the depicted example, it is appreciated that the shape and concentration of the gradual doping profile in photodiode 432 create a potential profile that increases gradually from the backside surface 472 to the front side surface 474 of semiconductor material layer 470 as shown, which pushes the image charge carriers e- up to the front side surface 474 and towards the center of photodiode 432 at the front side surface 474 beneath the charge collection gate 462.

As shown in the depicted example, the charge collection gate 462 is coupled to be biased with a static constant bias voltage (e.g., charge collection signal CCG), which generates the inversion layer 476 that collects the image charge e- from the photodiode 432 into the inversion layer 476 at the front side surface 474 of semiconductor material layer 470 under the charge collection gate 462. In one example, the collected image charge carriers e- are transferred from the inversion layer 476 of charge collection gate 462 by applying corresponding transfer signals TX1 and TX2 to the transfer gates 436A and 436B, respectively, and switch signals SW1 and SW2 to switch gates 438A and 438B, respectively. In one example, the first transfer signal TX1 and the second transfer signal TX1 are oscillating pulse trains that are out of phase with one another to alternatingly transfer the image charge e- from the inversion layer 476. As such, transfer gates 436A and 436B are switch on/off constantly to move the image charge e- from the inversion layer 476 of the charge collection gate 462 to switch gates SW1 438A and SW2 438B as shown.

It is appreciated that with the static biased charge collection gate 462 collecting the image charge in the inversion layer 476, the required voltage levels for the first and second transfer signals TX1 and TX2 to transfer the image charge from the inversion layer 476 are reduced, which can reduce power consumption of pixel circuit 422 in accordance with the teachings of the present invention. Stated in another way, the required voltage swings of first and second transfer signals TX1 and TX2 are reduced when compared to having to transfer the image charge from photodiode 432 without the inversion layer 476 of charge collection gate 462. For instance, in one example, voltage swings of less than 1.5 volts are needed for transfer signals TX1 and TX2 and the constant bias voltage. With the smaller required voltages for the constant bias and the first and second transfer signals TX1 and TX2, it is further appreciated therefore that smaller gate areas of transfer gates 436A and 436B are needed, and that switching speeds may be further increased in accordance with the teachings of the present invention.

FIGS. 5A-5F are various example timing diagrams 564 that illustrate operation of example of a time of flight light sensing systems including example charge collection gates with central collection photodiodes in time of flight pixels in accordance with the teachings of the present disclosure. It is appreciated that the timing diagrams may reference elements discussed above with respect to FIGS. 1-4, and as such similarly named and numbered elements described above are coupled and function similarly below.

Figure 5A:
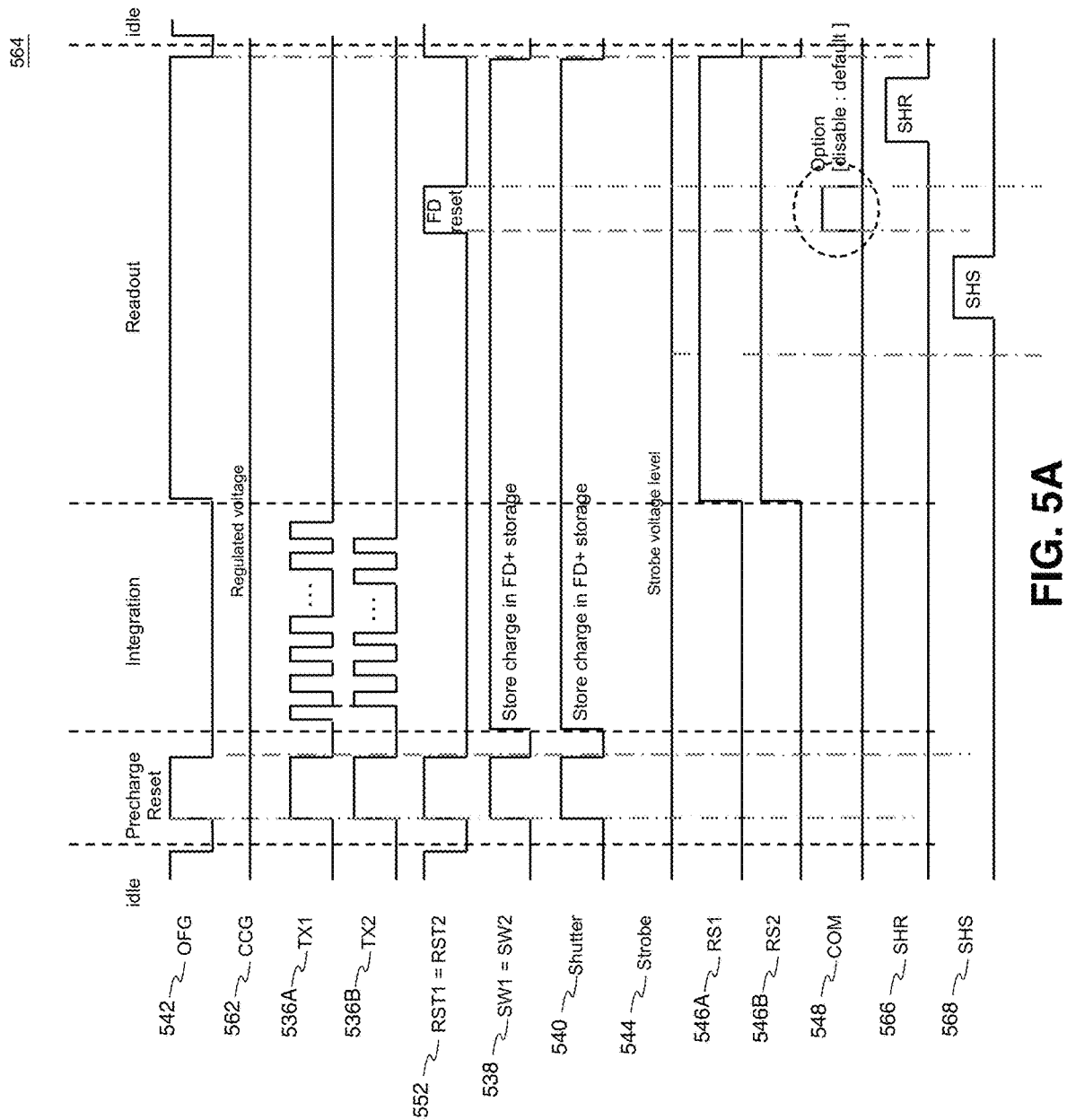
FIGS. 5A-5F are example timing diagrams that illustrate operation of example of a time of flight light sensing systems including an example charge collection gate with a central collection photodiode in time of flight pixels in accordance with the teachings of the present disclosure.

As shown in FIG. 5A, an example of operations for the pixel operating in a 3D depth mode begin with a pre-charge reset period, during which time the elements in the pixel are pre-charged or reset to initial values. As such, during the initial pre-charge or reset period, the overflow signal OFG 542, the transfer signals TX1 536A and TX2 536B, the reset signals RST1 and RST2 552, the switch signals SW1 and SW2 538, and shutter signal 240 are all pulsed high, while the strobe signal 544, row select signals RS1 546A and RS2 546B, and common mode reset signal COM 548 remain low. As shown in the example, the charge collection gate bias voltage 562 remains regulated at the constant voltage during the pre-charge reset period, the integration period, the readout period, and the idle period.

During the integration period, image charge carriers are photo-generated in the photodiode in response to incident light. The regulated charge collection gate bias voltage 562 applied to the charge collection gate generates an inversion layer with the photo-generated image charge carriers that are collected from the photodiode. The transfer signals TX1 536A and TX2 536B are alternatingly pulsed, which alternatingly transfers or pumps the photo-generated charge from the inversion layer to either to the first single shared channel region or the second single shared channel region in repeated individual succession during the integration period of the pixel. In addition, the switch signals SW1 and SW2 538 as well as the shutter signal 540 are enabled (e.g., set at a high logic signal level) during the integration period, which enables the charge transferred from the inversion layer to be stored in both floating diffusions as well as in the charge storage structures during the integration period. As such, the pixel is set for high FWC and low conversion gain in the depicted example in accordance with the teachings of the present invention.

During the readout period, the overflow signal OFG 542 is enabled, which enables the overflow transistor to drain excess image charge from the photodiode. As such, performance of the pixel can be improved in bright sunny outdoor conditions so that image charge generated by background ambient light can be drained through the overflow transistor during the readout period. The row select signals RS1 546A and RS2 546B are enabled, which enables the pixel output signals PIXOUT1 and PIXOUT2 to be read out from the pixel. The pixel output signals are sampled and held to sample the signal output values of the pixel, as indicated with the SHS 568 pulse. In the example, the floating diffusions are then reset, as indicated with the pulse of the reset signals RST1 and RST2 552. In one example, the common mode reset signal COM 548 may also be optionally pulsed as the reset signals RST1 and RST2 552 are pulsed to reset the floating diffusions to a common reset level, e.g., supply voltage of the voltage supply. In the example, the pixel output signals are then sampled and held again to sample the reset output values of the pixel, as indicated with the SHR 566 pulse.

As such, it is appreciated that the difference between the sampled signal output values and the sampled reset signal values can be computed to determine the pixel output values, for example by a differential amplification circuitry included in the control circuit 124 of FIG. 1, in accordance with the teachings of the present invention.

It is appreciated by skilled artisans that in the operation illustrated by FIG. 5A, the pixel output signal associated with photo-generated image charges is sampled prior to the sampling of the reset signal, and as such the image signal level and reset signal level are not correlated. Thus, no correlated double sampling (CDS) operation may be performed. But because the image charge storages are shared with charge storage structures during the image signal read out period as switch signals SW1 and SW2 538 are enabled after the reset of the floating diffusions, the full well capacity for the photodiode can be maximized and therefore suitable for outdoor imaging applications.

Figure 5B:
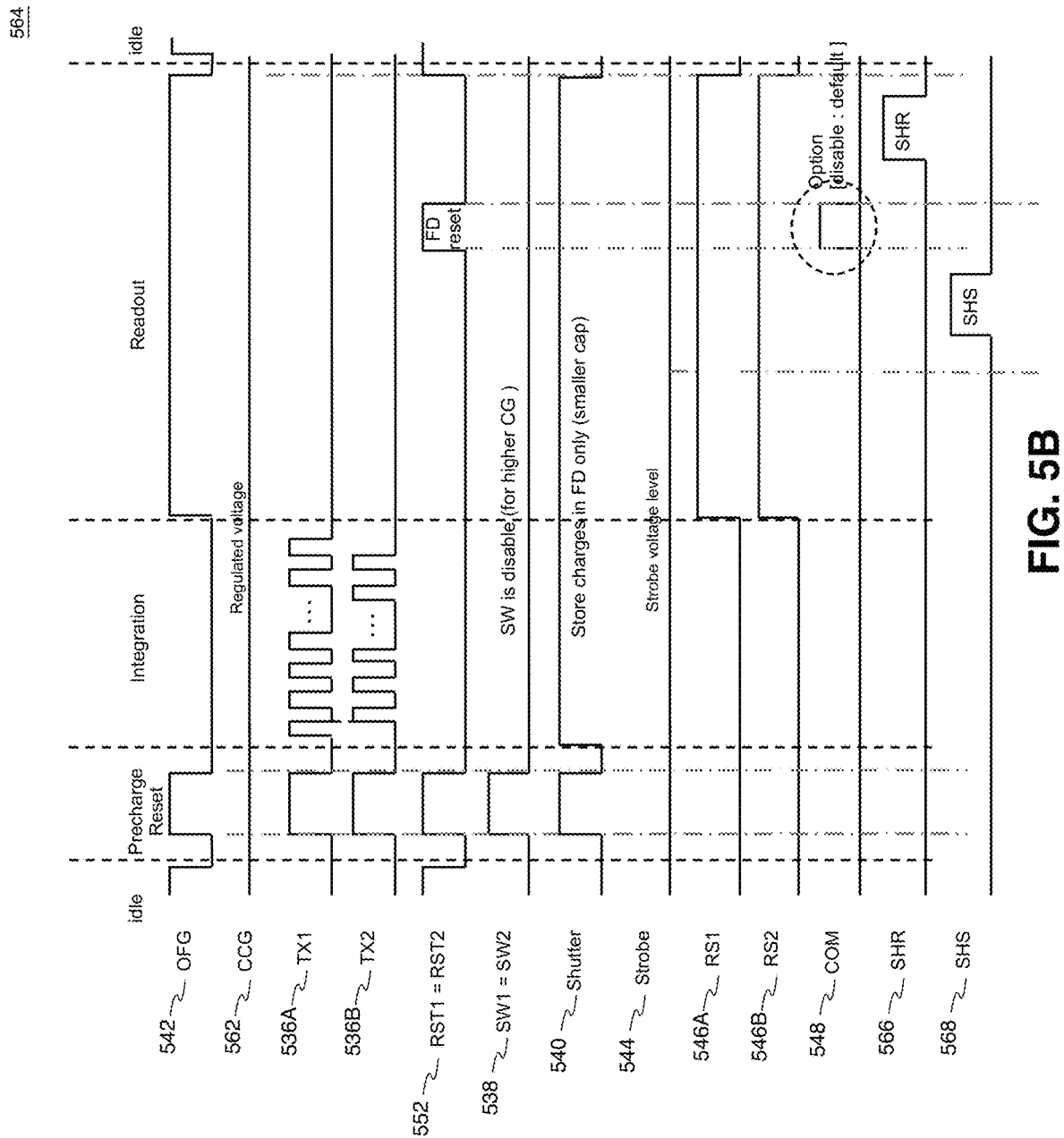

As shown in FIG. 5B, another example of operations for the pixel operating in a 3D depth mode begin with the pre-charge reset period, during which time the elements in the pixel are pre-charged or reset to initial values. As such, during the initial pre-charge or reset period, the overflow signal OFG 542, the transfer signals TX1 536A and TX2 536B, the reset signals RST1 and RST2 552, the switch signals SW1 and SW2 538, and shutter signal 540 are all pulsed high, while the strobe signal 544, row select signals RS1 546A and RS2 546B, and common mode reset signal COM 548 remain low. As shown in the example, the charge collection gate bias voltage 562 remains regulated at the constant voltage during the pre-charge reset period, the integration period, the readout period, and the idle period.

During the integration period, image charge carriers are photo-generated in the photodiode in response to incident light. The regulated charge collection gate bias voltage 562 applied to the charge collection gate generates an inversion layer with the photo-generated image charge carriers that are collected from the photodiode. The transfer signals TX1 536A and TX2 536B are alternatingly pulsed, which alternatingly transfers or pumps the photo-generated charge from the inversion layer to either to the first single shared channel region or the second single shared channel region in repeated individual succession during the integration period of the pixel. In addition, the switch signals SW1 and SW2 538 remain disabled while the shutter signal 540 is enabled during the integration period. As such, the charge transferred from the inversion layer is stored in both floating diffusions, but not in the charge storage structures during the integration period. As such, the pixel is set for low FWC and high conversion gain in the depicted example in accordance with the teachings of the present invention.

During the readout period, the overflow signal OFG 542 is enabled, which enables the overflow transistor to drain excess image charge from the photodiode. As such, performance of the pixel can be improved in bright sunny outdoor conditions so that image charge generated by background ambient light can be drained through the overflow transistor during the readout period. The shutter signal 540 and row select signals RS1 546A and RS2 546B are enabled during the readout period, which enables the pixel output signals PIXOUT1 and PIXOUT2 to be read out from the pixel. The pixel output signals are sampled and held during the readout period to sample the signal output values of the pixel, as indicated with the SHS 568 pulse. In the example, the floating diffusions are then reset, as indicated with the pulse of the reset signals RST1 and RST2 552. In one example, the common mode reset signal COM 548 may also be optionally pulsed as the reset signals RST1 and RST2 552 are pulsed to reset the floating diffusions to a common reset level, e.g., supply voltage of the voltage supply. In the example, the pixel output signals are then sampled and held again to sample the reset output values of the pixel, as indicated with the SHR 566 pulse.

It is appreciated by skilled artisans that in the operation illustrated by FIG. 5B, the pixel output signal associated with photo-generated image charges is also sampled prior to the sampling of the reset signal, thus no correlated double sampling (CDS) operation may be performed. It is appreciated that the difference between the sampled signal output values and the sampled reset signal values may be computed, for example by a differential amplification circuitry included in the control circuit 124 of FIG. 1, to determine the pixel output values in accordance with the teachings of the present invention.

It is appreciated that the pixel may be controlled, for example, by the control circuit 124 of FIG. 1 to selectively operate as illustrated in FIG. 5A for outdoor applications with the environment having a brighter light setting, or as illustrated in FIG. 5B for indoor applications with the environment having a darker light setting.

Figure 5C:
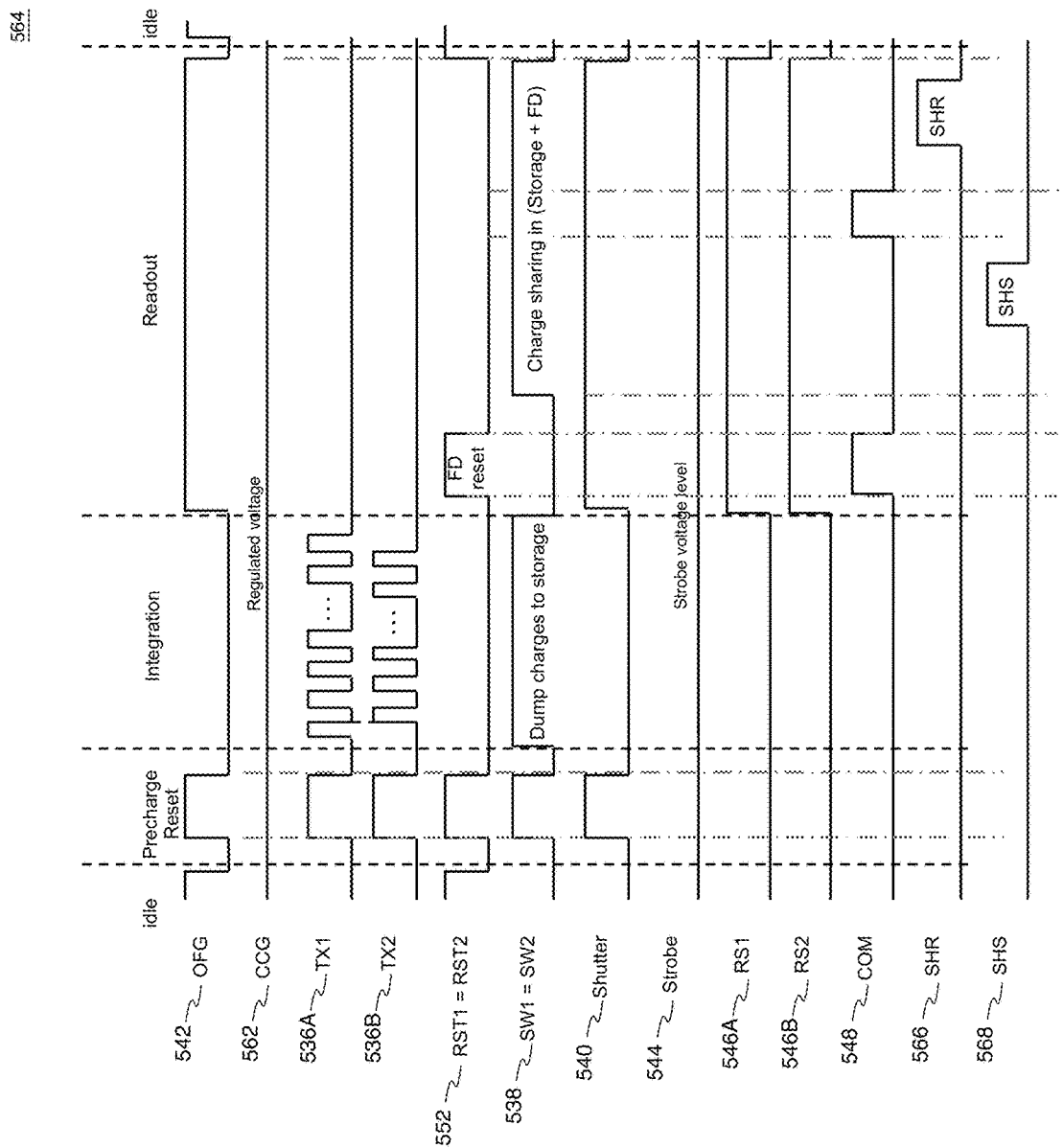

As shown in FIG. 5C, yet another example of operations for the pixel operating in a 3D depth mode begin with the pre-charge reset period, during which time the elements in the pixel are precharged or reset to initial values. As such, during the initial pre-charge or reset period, the overflow signal OFG 542, the transfer signals TX1 536A and TX2 536B, the reset signals RST1 and RST2 552, the switch signals SW1 and SW2 538, and shutter signal 540 are all pulsed high, while the strobe signal 544, row select signals RS1 546A and RS2 546B, and common mode reset signal COM 548 remain low. As shown in the example, the charge collection gate bias voltage 562 remains regulated at the constant voltage during the pre-charge reset period, the integration period, the readout period, and the idle period.

During the integration period, image charge carriers are photo-generated in the photodiode in response to incident light. The regulated charge collection gate bias voltage 562 applied to the charge collection gate generates an inversion layer with the photo-generated image charge carriers that are collected from the photodiode. The transfer signals TX1 536A and TX2 536B are alternatingly pulsed, which alternatingly transfers or pumps the photo-generated charge from the inversion layer to either to the first single shared channel region or the second single shared channel region in repeated individual succession during the integration period of the pixel. In addition, the shutter signal 540 remains disabled while the switch signals SW1 and SW2 538 are enabled during the integration period. As such, the charge transferred from the inversion layer is stored in the charge storage structures, but not in the floating diffusions during the integration period in the depicted example.

During the readout period, the overflow signal OFG 542 is enabled, which enables the overflow transistor to drain excess image charge from the photodiode. As such, performance of the pixel can be improved in bright sunny outdoor conditions so that image charge generated by background ambient light can be drained through the overflow transistor during the readout period. In the example, the switch signals SW1 and SW2 538 are initially disabled during the readout period, which isolates the charged stored in the charge storage structures from the floating diffusions. The shutter signal 540 and the row select signals RS1 546A and RS2 546B are enabled, which enables the pixel output signals PIXOUT1 and PIXOUT2 to be read out from the pixel. The floating diffusions are then reset, as indicated with the pulse of the reset signals RST1 and RST2 552. In one example, the common mode reset signal COM 548 is also pulsed as the reset signals RST1 and RST2 552 are pulsed to reset the floating diffusions to a common reset level, e.g., supply voltage of the voltage supply. After the reset, the switch signals SW1 and SW2 538 are then enabled in the example so that the charge stored in the charge storage structures during integration can now be transferred to the floating diffusions. The pixel output signals are then sampled and held to sample the signal output values of the pixel, as indicated with the SHS 568 pulse. In the example, the common mode reset signal COM 548 is pulsed again after the signal output values are sampled to reset the common mode level between the first and second floating diffusions. In the example, the pixel output signals are then sampled and held again to sample the reset output value of the pixel, as indicated with the SHR 566 pulse. It is appreciated by skilled artisans that in the operation illustrated by FIG. 5C, the pixel output signal associated with photo-generated image charges is also sampled prior to the sampling of the reset signal, thus no correlated double process operation may be performed. It is further appreciated that the difference between the sampled reset signal values and the sampled signal output values can be determined, for example by a differential amplification circuitry included in the control circuit 124 of FIG. 1, to determine the pixel output values in accordance with the teachings of the present invention. The operation illustrated by FIG. 5C may be selected to maximize full well capacity, i.e., the combination capacity of the charge storage structures and the floating diffusions, but with lower conversion gain, and hence is applicable for outdoor imaging applications.

Figure 5D:
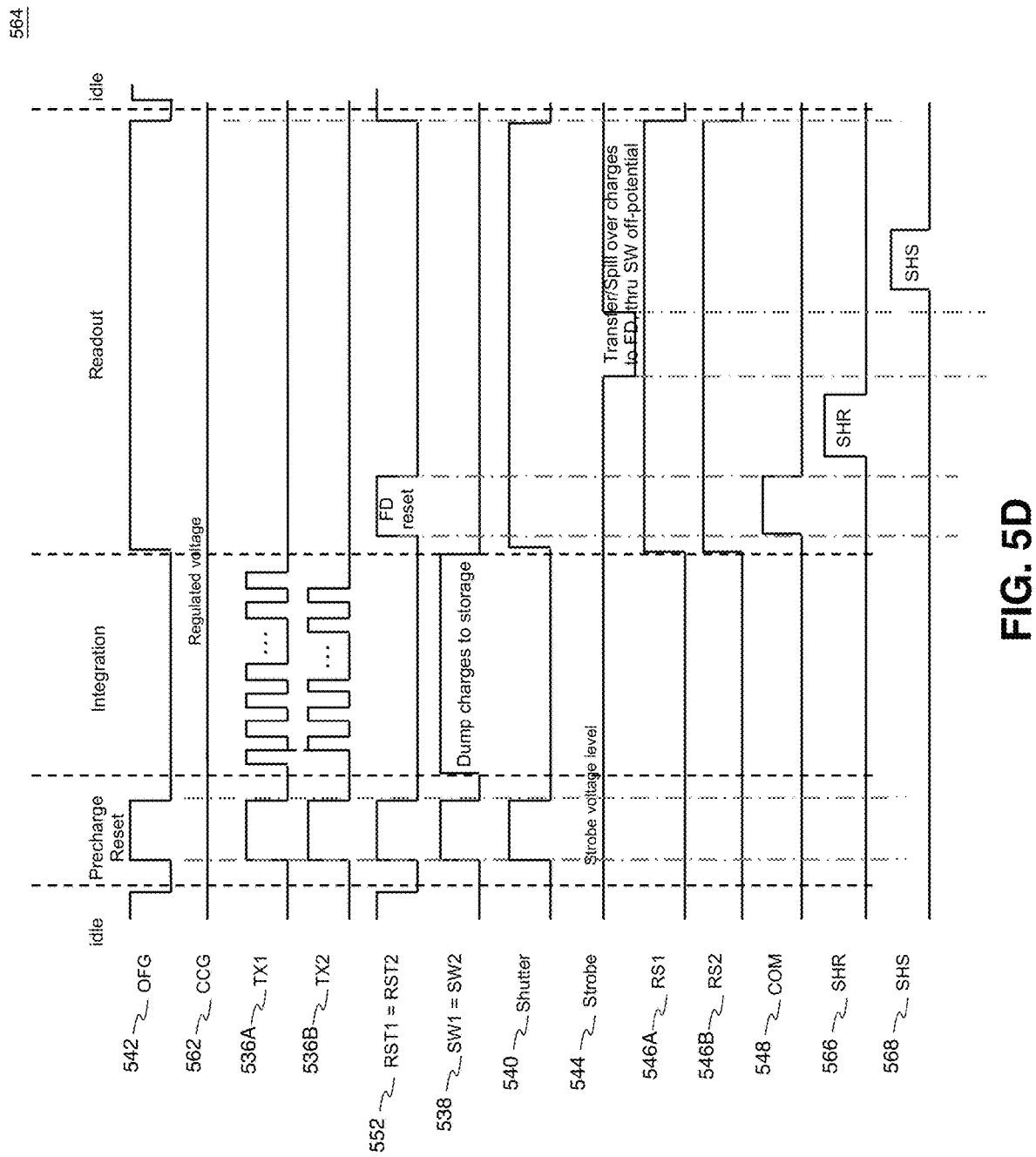

As shown in FIG. 5D, still another example of operations for the pixel operating in a 3D depth mode begin with the pre-charge reset period, during which time the elements in the pixel are pre-charged or reset to initial values. As such, during the initial pre-charge or reset period, the overflow signal OFG 542, the transfer signals TX1 536A and TX2 536B, the reset signals RST1 and RST2 552, the switch signals SW1 and SW2 538, and shutter signal 540 are all pulsed high, while row select signals RS1 546A and RS2 546B, and common mode reset signal COM 548 remain low. In the example, the strobe signal 544 is set to a first voltage level. As shown in the example, the charge collection gate bias voltage 562 remains regulated at the constant voltage during the pre-charge reset period, the integration period, the readout period, and the idle period.

During the integration period, image charge carriers are photo-generated in the photodiode in response to incident light. The regulated charge collection gate bias voltage 562 applied to the charge collection gate generates an inversion layer with the photo-generated image charge carriers that are collected from the photodiode. The transfer signals TX1 536A and TX2 536B are alternatingly pulsed, which alternatingly transfers or pumps the photo-generated charge from the inversion layer to either to the first single shared channel region or the second single shared channel region in repeated individual succession during the integration period of the pixel. In addition, the shutter signal 540 remains disabled while the switch signals SW1 and SW2 538 are enabled during the integration period. As such, the charge transferred from the photodiode is stored in the charge storage structures, but not in the floating diffusions during the integration period in the depicted example. In the example, the strobe signal 544 coupled to the charge storage structures remains set to the first voltage level during integration.

During the readout period, the overflow signal OFG 542 is enabled, which enables the overflow transistor to drain excess image charge from the photodiode. As such, performance of the pixel can be improved in bright sunny outdoor conditions so that image charge generated by background ambient light can be drained through the overflow transistor during the readout period. In the example, the switch signals SW1 and SW2 538 are disabled during the readout period, which turns off the switch gates to isolate the charged stored in the charge storage structures from the floating diffusions. The shutter signal 540 and the row select signals RS1 546A and RS2 546B are enabled, which enables the pixel output signals PIXOUT1 and PIXOUT2 to be read out from the pixel. The floating diffusions are then reset, as indicated with the pulse of the reset signals RST1 and RST2 552. In one example, the common mode reset signal COM 548 is also pulsed as the reset signals RST1 and RST2 552 are pulsed to reset the floating diffusions to a common reset level, e.g., supply voltage of the voltage supply. In the example, the pixel output signals are then sampled and held to sample the reset output value of the pixel, as indicated with the SHR 566 pulse. After the reset output value of the pixel has been sampled, the strobe signal 544 is pulsed or toggled from the first level to a second level as shown so that the charges stored in the first and second charge storage structures spill over to the first and second floating diffusions through the first and second switch gates, which remain disabled by the switch signals SW1 and SW2 538 during the readout period of the pixel. In the example, the second level of the strobe signal 544 is less than the first level. The pixel output signals are then sampled and held again to sample the signal output values of the pixel, as indicated with the SHS 568 pulse. As such, It is appreciated by skilled artisans that in the operation illustrated by FIG. 5D, the pixel output signal associated with photo-generated image charges is sampled after the sampling of the reset signal, thus a correlated double sampling (CDS) operation may be performed to determine the difference between the sampled reset signal values and the sampled signal output values, so as to determine the CDS pixel output values in accordance with the teachings of the present invention.

In one embodiment, a wider dynamical range of the pixel may be further achieved by sampling the signal read out multiple times with different conversion gains. The conversion gain may be varied with selectively turned on switch gates and shutter gates. For instance, during a first time interval of read out, the switch gates and shutter gates can be turned on to provide low conversion gain for signal output read out as the conversion gain for the pixel will be determined by the capacitance of charge storage structure and the floating diffusions. During a second time interval of read out, the switch gates may be turned off while shutter gates are turned on to provide mid-level conversion gain for signal output read out as the conversion gain for the pixel will be determined by the capacitance of the shutter gates and the floating diffusion. During a third time interval of read out, the switch gates and shutter gates may be turned off to provide high conversion gain for signal output as the conversion gain for the pixel in the third time interval will be determined by the effective capacitance of the floating diffusion.

Figure 5E:
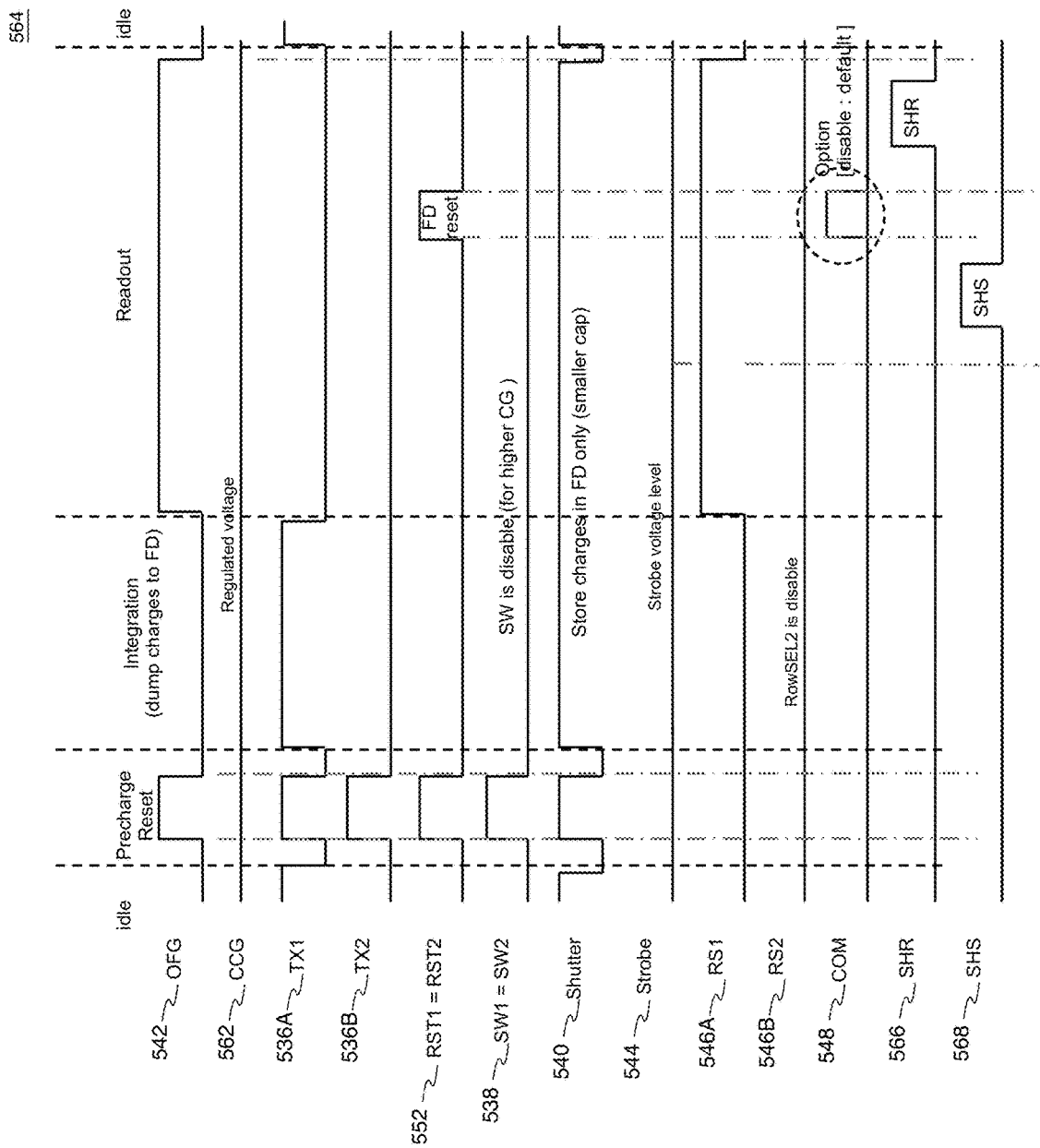

As shown in FIG. 5E, an example of operations for the pixel operating in an a 2D intensity mode begin with a pre-charge reset period, during which time the elements in the pixel are pre-charged or reset to initial values. As such, during the initial pre-charge or reset period, the overflow signal OFG 542, the transfer signals TX1 536A and TX2 536B, the reset signals RST1 and RST2 552, the switch signals SW1 and SW2 538, and shutter signal 540 are all pulsed high, while the strobe signal 544, row select signals RS1 546A and RS2 546B, and common mode reset signal COM 548 remain low. As shown in the example, the charge collection gate bias voltage 562 remains regulated at the constant voltage during the pre-charge reset period, the integration period, the readout period, and the idle period.

During the integration period, image charge carriers are photo-generated in the photodiode in response to incident light. The regulated charge collection gate bias voltage 562 applied to the charge collection gate generates an inversion layer with the photo-generated image charge carriers that are collected from the photodiode. The transfer signal TX1 536A is enabled while the transfer signal TX2 536B is disabled. Thus, it is appreciated that in the depicted example, first transfer transistor, and first floating diffusion are utilized to generate the first output pixel value PIXOUT1. With the transfer signal TX1 536A enabled, the photo-generated charge collected in the inversion layer is transferred to the first single shared channel region during the integration period of the pixel. In addition, the switch signals SW1 and SW2 538 remain disabled while the shutter signal 540 is enabled during the integration period. As such, the charge transferred from the inversion layer is stored in the first floating diffusion, but not in the charge storage structures during the integration period. As such, the pixel is set for low FWC and high conversion gain in the depicted example in accordance with the teachings of the present invention.

During the readout period, the overflow signal OFG 542 is enabled, which enables the overflow transistor to drain excess image charge from the photodiode. As such, performance of the pixel can be improved in bright sunny outdoor conditions so that image charge generated by background ambient light can be drained through the overflow transistor during the readout period. The shutter signal 540 and row select signals RS1 546A and RS2 546B are enabled during the readout period, which enables the pixel output signal PIXOUT1 to be read out from the pixel. The pixel output signals are sampled and held during the readout period to sample the signal output value of the pixel, as indicated with the SHS 568 pulse. In the example, the floating diffusions are then reset, as indicated with the pulse of the reset signals RST1 and RST2 552. In one example, the common mode reset signal COM 548 may also be optionally pulsed as the reset signals RST1 and RST2 552 are pulsed to reset the floating diffusions to a common reset level, e.g., supply voltage of the voltage supply. In the example, the pixel output signals are then sampled and held again to sample the reset output values of the pixel, as indicated with the SHR 566 pulse. It is appreciated by skilled artisans that in the operation illustrated by FIG. 5E, the pixel output signal associated with photo-generated image charges is also sampled prior to the sampling of the reset signal, and thus no correlated double sampling operation may be performed. It is further appreciated that the difference between the sampled signal output values and the sampled reset signal values can be computed, for example by a differential amplification circuitry included in the control circuit 124 of FIG. 1, to determine the pixel output value in accordance with the teachings of the present invention.

Figure 5F:
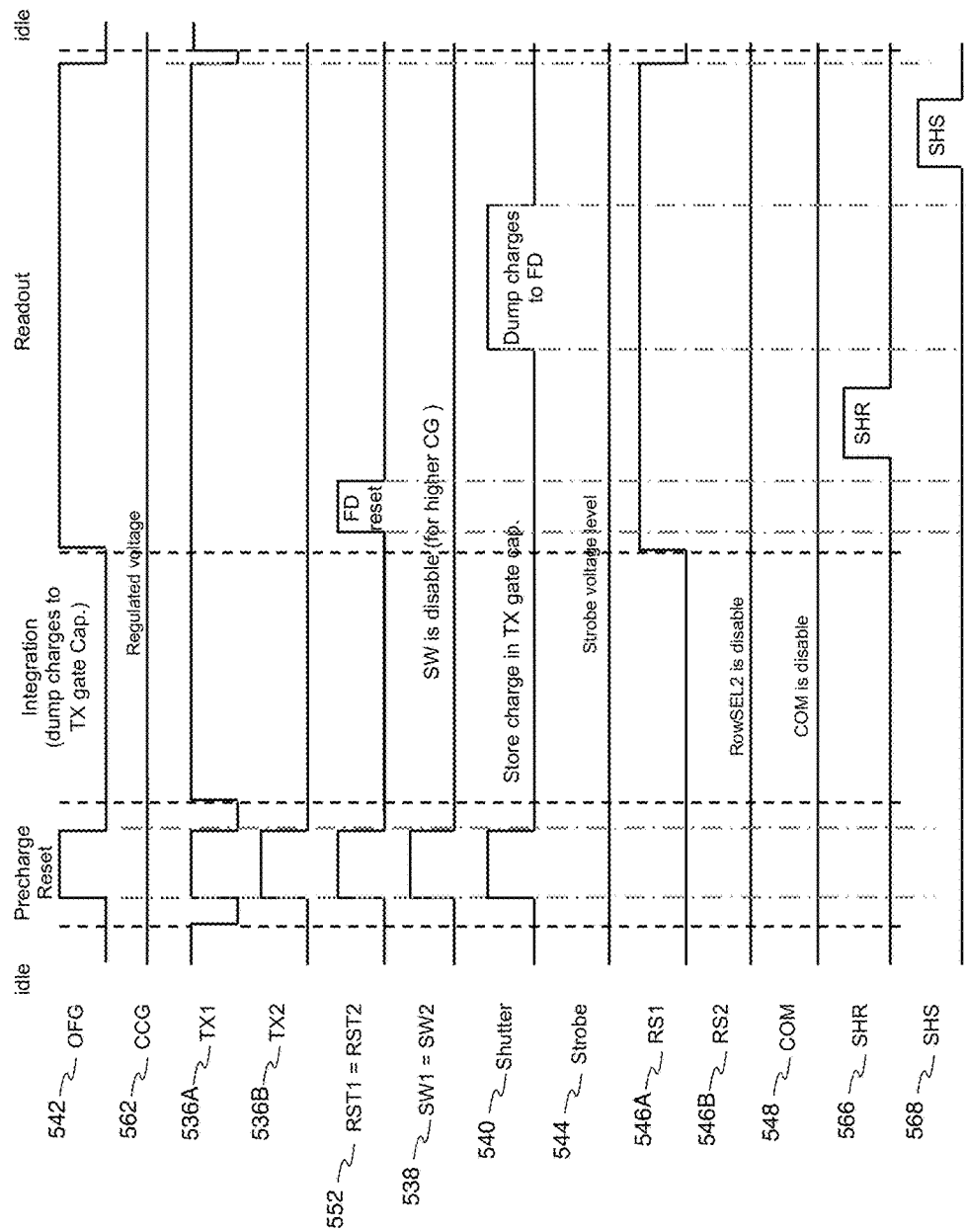

As shown in FIG. 5F, another example of operations for the pixel operating in an a 2D intensity mode begin with a pre-charge reset period, during which time the elements in the pixel are pre-charged or reset to initial values. As such, during the initial pre-charge or reset period, the overflow signal OFG 542, the transfer signals TX1 536A and TX2 536B, the reset signals RST1 and RST2 552, the switch signals SW1 and SW2 538, and shutter signal 540 are all pulsed high, while the strobe signal 544, row select signals RS1 546A and RS2 546B, and common mode reset signal COM 548 remain low. As shown in the example, the charge collection gate bias voltage 562 remains regulated at the constant voltage during the pre-charge reset period, the integration period, the readout period, and the idle period.

During the integration period, image charge carriers are photo-generated in the photodiode in response to incident light. The regulated charge collection gate bias voltage 562 applied to the charge collection gate generates an inversion layer with the photo-generated image charge carriers that are collected from the photodiode. The transfer signal TX1 536A is enabled while the transfer signal TX2 536B is disabled. Thus, it is appreciated that in the depicted example, first transfer transistor, and first floating diffusion are utilized to generate the first output pixel value PIXOUT1. With the transfer signal TX1 536A enabled, the photo-generated image charge collected in the inversion layer is transferred to the first single shared channel region during the integration period of the pixel. In addition, the switch signals SW1 and SW2 538 as well as shutter signal 540 remain disabled during the integration period. As such, the charge transferred from the inversion layer is stored in the transfer gate capacitance, but not in the charge storage structures or in the floating diffusions during the integration period. As such, the pixel is set for low FWC and high conversion gain in the depicted example in accordance with the teachings of the present invention.

During the readout period, the overflow signal OFG 542 is enabled, which enables the overflow transistor to drain excess image charge from the photodiode. As such, performance of the pixel can be improved in bright sunny outdoor conditions so that image charge generated by background ambient light can be drained through the overflow transistor during the readout period. In the example, the transfer gate signal 536A remains high during the readout period so that the charge transferred from the inversion layer during the integration period remains stored in the transfer gate capacitance. The switch signals SW1 and SW2 538 are also disabled during the readout period, which turns off the switch gates to isolate the charged stored in the transfer gate capacitance from the charge storage structures. The shutter signal 540 and the row select signals RS1 546A and RS2 546B are enabled, which enables the pixel output signals PIXOUT1 to be read out from the pixel. The floating diffusions are then reset, as indicated with the pulse of the reset signals RST1 and RST2 552. In the example, the pixel output signals are then sampled and held to sample the reset output values of the pixel, as indicated with the SHR 566 pulse. After the reset output value of the pixel has been sampled, the shutter signal 540 is pulsed as shown so that the charges stored in the first transfer gate capacitance are transferred to the first floating diffusion. The pixel output signals are then sampled and held again to sample the signal output values of the pixel, as indicated with the SHS 568 pulse. As such, it is appreciated that the difference between the sampled reset signal values and the sampled signal output values can be determined by a correlated double sampling operation to determine the CDS pixel output values in accordance with the teachings of the present invention.

It is appreciated by those skilled in the art that the operation illustrated by FIGS. 5A-5F may be implemented by a control circuitry (e.g., the control circuitry 124 of FIG. 1) of a time of flight light sensing system. The control circuitry (may include logics for controlling the operations of a light source (e.g., the light source 102 of FIG. 1) and an image sensor having a plurality of pixels (e.g., the image sensor 120 of FIG. 1) of the time of flight light sensing system. The control circuitry may further include a build-in memory (e.g., random access memory, erasable read only memory, or the like), and the memory may be programmed in such way that it causes the control circuitry to control the light source to emit light and the image sensor to detect the reflective light from an object (e.g., the object 130 of FIG. 1) and selectively perform the operations described in FIGS. 5A-5F. As stated above, the control circuitry may be an application specific integrated circuit (ASIC—custom designed for the time of flight light sensing system), a general purpose processor that can be programed in many different ways, or a combination of the two.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel circuit, comprising:
a photodiode disposed in a semiconductor material layer to accumulate image charge in response to light incident upon the photodiode;
a charge collection gate coupled to the photodiode, wherein the charge collection gate is disposed over the photodiode to generate an inversion layer in the semiconductor material layer under the charge collection gate and over the photodiode to collect the image charge from the photodiode; and
a first transfer gate disposed proximate to the charge collection gate such that the inversion layer is between the photodiode and the first transfer gate, wherein the first transfer gate is coupled to transfer the image charge collected from the photodiode through the inversion layer in response to a first transfer signal.

2. The pixel circuit of claim 1, wherein the charge collection gate is coupled to be biased with a constant bias voltage to collect the image charge from the photodiode into the inversion layer.

3. The pixel circuit of claim 1, further comprising a second transfer gate disposed proximate to the charge collection gate such that the inversion layer is between the photodiode and the second transfer gate, wherein the second transfer gate is coupled to transfer the image charge collected from the photodiode through the inversion layer in response to a second transfer signal, wherein the first transfer signal and the second transfer signal comprise oscillating pulse trains that are out of phase with one another during an integration period of the pixel circuit to alternatingly transfer the image charge from the inversion layer.

4. The pixel circuit of claim 3, further comprising:
a first channel region disposed in the semiconductor material layer, wherein the first transfer gate is coupled to transfer the image charge from the inversion layer into the first channel region in response to the first transfer signal; and
a second channel region disposed in the semiconductor material layer, wherein the second transfer gate is coupled to transfer the image charge from in the inversion layer into the second channel region in response to the second transfer signal.

5. The pixel circuit of claim 4, further comprising:
a first shutter gate disposed proximate to the first channel region, wherein the first shutter gate is coupled to transfer the image charge in the first channel region to a first floating diffusion disposed in the semiconductor material layer in response to a first shutter signal; and
a second shutter gate disposed proximate to the second channel region, wherein the second shutter gate is coupled to transfer the image charge in the second channel region to a second floating diffusion disposed in the semiconductor material layer in response to a second shutter signal.

6. The pixel circuit of claim 5, further comprising:
a first switch gate disposed proximate to the first channel region, wherein the first switch gate is configured to couple the first channel region to a first charge storage structure disposed in the semiconductor material layer in response to a first switch signal; and
a second switch gate disposed proximate to the second channel region, wherein the second switch gate is configured to couple the second channel region to a second charge storage structure disposed in the semiconductor material layer in response to a second switch signal.

7. The pixel circuit of claim 6, wherein the first channel region is a first single shared channel region, wherein the second channel region is a second single shared channel region, wherein the pixel circuit further comprises:
a first tri-gate charge transfer block coupled to the charge collection gate, wherein the first tri-gate charge transfer block comprises the first single shared channel region, and the first transfer gate, the first shutter gate, and the first switch gate disposed proximate to the first single shared channel region; and
a second tri-gate charge transfer block coupled to the charge collection gate, wherein the second tri-gate charge transfer block comprises the second single shared channel region, and the second transfer gate, the second shutter gate, and the second switch gate disposed proximate to the second single shared channel region.

8. The pixel circuit of claim 7, wherein the first single shared channel region and the second single shared channel region are doped regions.

9. The pixel circuit of claim 7, wherein the first single shared channel region and the second single shared channel region are un-doped regions.

10. The pixel circuit of claim 6, wherein the first charge storage structure comprises a first capacitor, wherein the second charge storage structure comprises a second capacitor, wherein the first and second switch gates are configured to couple the first and second channel regions to the first and second capacitors to adjust a full well capacity (FWC) of the pixel circuit in response to the first and second switch signals.

11. The pixel circuit of claim 6, further comprising an overflow transistor coupled between a voltage supply and the photodiode, wherein the overflow transistor is configured to drain excess image charge from the photodiode in response to an overflow signal.

12. The pixel circuit of claim 6, further comprising a common mode transistor coupled between the first floating diffusion and the second floating diffusion, wherein the common mode transistor is configured to reset a common mode level between the first floating diffusion and the second floating diffusion in response to a common mode reset signal.

13. The pixel circuit of claim 6, further comprising:
a first reset transistor coupled between a voltage supply and the first floating diffusion, wherein the first reset transistor is coupled to reset the first floating diffusion in response to a first reset signal,
a first source follower transistor coupled to the first floating diffusion, wherein the first source follower transistor is coupled to generate a first pixel output signal in response to the image charge in the first floating diffusion; and
a first row select transistor coupled to the first source follower transistor, wherein the first row select transistor is coupled to output the first pixel output signal from the first source follower transistor in response to a first row select signal.

14. The pixel circuit of claim 13, further comprising:
a second reset transistor coupled between the voltage supply and the second floating diffusion, wherein the second reset transistor is coupled to reset the second floating diffusion in response to a second reset signal,
a second source follower transistor coupled to the second floating diffusion, wherein the second source follower transistor is coupled to generate a second pixel output signal in response to the image charge in the second floating diffusion; and
a second row select transistor coupled to the second source follower transistor, wherein the second row select transistor is coupled to output the second pixel output signal from the second source follower transistor in response to a second row select signal.

15. The pixel circuit of claim 1, wherein the semiconductor material layer comprises a semiconductor substrate layer including dopants having a first polarity, and wherein the photodiode includes a doped region including dopants having a second polarity disposed in the semiconductor substrate layer.

16. The pixel circuit of claim 15, wherein the semiconductor substrate layer including the dopants having the first polarity comprises a p-type semiconductor substrate layer, and wherein the doped region including the dopants having the second polarity comprises an n-type doped region disposed in the p-type semiconductor substrate layer.

17. The pixel circuit of claim 16, wherein the light incident upon the photodiode is directed through a backside surface of the semiconductor material layer into the n-type doped region, wherein a cross sectional area of the n-typed doped region decreases from a wide cross sectional area of a portion of the n-typed doped region closest to the backside surface of the semiconductor material layer to a narrow cross sectional area of a portion of the n-typed doped region closest to a front side surface of the semiconductor material layer.

18. The pixel circuit of claim 17, wherein a doping profile of the dopants in the n-typed doped region is a gradient doping profile that increases from the portion of the n-typed doped region closest to the backside surface of the semiconductor material layer to the portion of the n-typed doped region closest to the front side surface of the semiconductor material layer.

19. A light sensing system, comprising:
a light source to emit light to an object;
a pixel array optically coupled to sense the emitted light that is reflected from the object, wherein the pixel array includes a plurality of pixels, wherein each one of the pixels comprises:
a photodiode disposed in a semiconductor material layer to accumulate image charge in response to light incident upon the photodiode;
a charge collection gate coupled to the photodiode, wherein the charge collection gate is disposed over the photodiode to generate an inversion layer in the semiconductor material layer under the charge collection gate and over the photodiode to collect the image charge from the photodiode; and
a first transfer gate disposed proximate to the charge collection gate such that the inversion layer is between the photodiode and the first transfer gate, wherein the first transfer gate is coupled to transfer the image charge collected from the photodiode through the inversion layer in response to a first transfer signal; and
a control circuitry coupled to control the light source and the pixel array to sense the emitted light that is reflected from the object to the pixel array.

20. The light sensing system of claim 19, wherein the charge collection gate is coupled to be biased with a constant bias voltage to collect the image charge from the photodiode into the inversion layer.

21. The light sensing system of claim 20, wherein each one of the pixels further comprises a second transfer gate disposed proximate to the charge collection gate such that the inversion layer is between the photodiode and the second transfer gate, wherein the second transfer gate is coupled to transfer the image charge collected from the photodiode through the inversion layer in response to a second transfer signal, wherein the first transfer signal and the second transfer signal comprise oscillating pulse trains that are out of phase with one another during an integration period of the respective pixel to alternatingly transfer the image charge from the inversion layer.

22. The light sensing system of claim 21, wherein each one of the pixels further comprises:
a first channel region disposed in the semiconductor material layer, wherein the first transfer gate is coupled to transfer the image charge from the inversion layer into the first channel region in response to the first transfer signal; and
a second channel region disposed in the semiconductor material layer, wherein the second transfer gate is coupled to transfer the image charge from in the inversion layer into the second channel region in response to the second transfer signal.

23. The light sensing system of claim 22, wherein each one of the pixels further comprises:
a first shutter gate disposed proximate to the first channel region, wherein the first shutter gate is coupled to transfer the image charge in the first channel region to a first floating diffusion disposed in the semiconductor material layer in response to a first shutter signal; and
a second shutter gate disposed proximate to the second channel region, wherein the second shutter gate is coupled to transfer the image charge in the second channel region to a second floating diffusion disposed in the semiconductor material layer in response to a second shutter signal.

24. The light sensing system of claim 23, wherein each one of the pixels further comprises:
a first switch gate disposed proximate to the first channel region, wherein the first switch gate is configured to couple the first channel region to a first charge storage structure disposed in the semiconductor material layer in response to a first switch signal; and a second switch gate disposed proximate to the second channel region, wherein the second switch gate is configured to couple the second channel region to a second charge storage structure disposed in the semiconductor material layer in response to a second switch signal.

25. The light sensing system of claim 24, wherein the first channel region is a first single shared channel region, wherein the second channel region is a second single shared channel region, wherein each one of the pixels further comprises:
a first tri-gate charge transfer block coupled to the charge collection gate, wherein the first tri-gate charge transfer block comprises the first single shared channel region, and the first transfer gate, the first shutter gate, and the first switch gate disposed proximate to the first single shared channel region; and
a second tri-gate charge transfer block coupled to the charge collection gate, wherein the second tri-gate charge transfer block comprises the second single shared channel region, and the second transfer gate, the second shutter gate, and the second switch gate disposed proximate to the second single shared channel region.

26. The light sensing system of claim 25, wherein the first single shared channel region and the second single shared channel region are doped regions.

27. The light sensing system of claim 25, wherein the first single shared channel region and the second single shared channel region are un-doped regions.

28. The light sensing system of claim 24, wherein the first charge storage structure comprises a first capacitor, wherein the second charge storage structure comprises a second capacitor, wherein the first and second switch gates are configured to couple the first and second channel regions to the first and second capacitors to adjust a full well capacity (FWC) of the respective pixel in response to the first and second switch signals.

29. The light sensing system of claim 24, wherein each one of the pixels further comprises an overflow transistor coupled between a voltage supply and the photodiode, wherein the overflow transistor is configured to drain excess image charge from the photodiode in response to an overflow signal.

30. The light sensing system of claim 24, wherein each one of the pixels further comprises a common mode transistor coupled between the first floating diffusion and the second floating diffusion, wherein the common mode transistor is configured to reset a common mode level between the first floating diffusion and the second floating diffusion in response to a common mode reset signal.

31. The light sensing system of claim 24, wherein each one of the pixels further comprises:
a first reset transistor coupled between a voltage supply and the first floating diffusion, wherein the first reset transistor is coupled to reset the first floating diffusion in response to a first reset signal,
a first source follower transistor coupled to the first floating diffusion, wherein the first source follower transistor is coupled to generate a first pixel output signal in response to the image charge in the first floating diffusion; and
a first row select transistor coupled to the first source follower transistor, wherein the first row select transistor is coupled to output the first pixel output signal from the first source follower transistor in response to a first row select signal.

32. The light sensing system of claim 31, wherein each one of the pixels further comprises:
a second reset transistor coupled between the voltage supply and the second floating diffusion, wherein the second reset transistor is coupled to reset the second floating diffusion in response to a second reset signal,
a second source follower transistor coupled to the second floating diffusion, wherein the second source follower transistor is coupled to generate a second pixel output signal in response to the image charge in the second floating diffusion; and
a second row select transistor coupled to the second source follower transistor, wherein the second row select transistor is coupled to output the second pixel output signal from the second source follower transistor in response to a second row select signal.

33. The light sensing system of claim 19, wherein the semiconductor material layer comprises a semiconductor substrate layer including dopants having a first polarity, and wherein the photodiode includes a doped region including dopants having a second polarity disposed in the semiconductor substrate layer.

34. The light sensing system of claim 33, wherein the semiconductor substrate layer including the dopants having the first polarity comprises a p-type semiconductor substrate layer, and wherein the doped region including the dopants having the second polarity comprises an n-type doped region disposed in the p-type semiconductor substrate layer.

35. The light sensing system of claim 34, wherein the light incident upon the photodiode is directed through a backside surface of the semiconductor material layer into the n-type doped region, wherein a cross sectional area of the n-typed doped region decreases from a wide cross sectional area of a portion of the n-typed doped region closest to the backside surface of the semiconductor material layer to a narrow cross sectional area of a portion of the n-typed doped region closest to a front side surface of the semiconductor material layer.

36. The light sensing system of claim 35, wherein a doping profile of the dopants in the n-typed doped region is a gradient doping profile that increases from the portion of the n-typed doped region closest to the backside surface of the semiconductor material layer to the portion of the n-typed doped region closest to the front side surface of the semiconductor material layer.

37. The light sensing system of claim 19, wherein the control circuitry is coupled to sense a time of flight of the emitted light that is reflected from the object to the pixel array by detecting a phase difference between the emitted light and the emitted light that is reflected from the object to the pixel array.

38. A method of sensing light using a pixel, the method comprising:
illuminating a photodiode disposed in a semiconductor material layer with light reflected from an object;
accumulating charge in the photodiode that is photo-generated in response to the light reflected from the object during an integration period of the pixel;
generating an inversion layer in the semiconductor material layer over the photodiode and under a charge collection gate disposed over the photodiode with the charge collected from the photodiode, wherein the inversion layer is between the photodiode and a first transfer gate;
transferring the charge collected from the photodiode through the inversion layer to a first channel region in the semiconductor material layer in response to enabling the first transfer gate in response to a first transfer signal;

transferring the charge from the first channel region to a first floating diffusion in response to enabling a first shutter gate in response to a first shutter signal;

converting the charge in the first floating diffusion to a first pixel output signal with a first source follower transistor coupled to the first floating diffusion; and reading the first pixel output signal during a readout period of the pixel that occurs after the integration period of the pixel.

39. The method of claim 38, further comprising:

resetting the first floating diffusion in response to enabling a first reset transistor in response to a first reset signal;

reading a first reset output value from the first floating diffusion after resetting the first floating diffusion; and determining a difference between the first pixel output signal and the first reset output value to determine a first pixel output value.

40. The method of claim 39, wherein said resetting the first floating diffusion and said reading the first reset output value occur prior to said transferring the charge from the first channel region to the first floating diffusion and said reading the first pixel output signal.

41. The method of claim 39, wherein said resetting the first floating diffusion and said reading the first reset output value occur after said transferring the charge from the first channel region to the first floating diffusion and said reading the first pixel output signal.

42. The method of claim 38, further comprising resetting a common mode level between the first floating diffusion and a second floating diffusion in response to enabling a common mode transistor coupled between the first floating diffusion and the second floating diffusion during said resetting the first floating diffusion.

43. The method of claim 38, further comprising resetting the pixel during a pre-charge reset period of the pixel that occurs prior to the integration period of the pixel.

44. The method of claim 38, further comprising enabling an overflow transistor coupled between a voltage supply and the photodiode during the readout period of the pixel, wherein the overflow transistor is configured to drain excess image charge from the photodiode in response to the overflow signal.

45. The method of claim 38, further comprising:

transferring the charge collected from the photodiode through the inversion layer to a second channel region in the semiconductor material layer in response to enabling a second transfer gate in response to a second transfer signal, wherein the inversion layer is between the photodiode and the second transfer gate;

transferring the charge from the second channel region to a second floating diffusion in response to enabling a second shutter gate in response to a second shutter signal;

converting the charge in the second floating diffusion to a second pixel output signal with a second source follower transistor coupled to the second floating diffusion; and reading the second pixel output signal during the readout period of the pixel that occurs after the integration period of the pixel.

46. The method of claim 45, wherein said transferring the charge from the inversion layer to the first channel region and wherein said transferring the charge from the inversion layer to the second channel region comprises alternatingly transferring the charge from the inversion layer to either to the first channel region or the second channel region in repeated individual succession in response to the first transfer signal and the second transfer signal during the integration period of the pixel.

47. The method of claim 46, wherein the first transfer signal and the second transfer signal comprise oscillating pulse trains that are out of phase with one another during the integration period of the pixel.

48. The method of claim 46, further comprising:

enabling a first switch gate in response to a first switch signal to couple the first channel region to a first charge storage structure disposed in the semiconductor material layer in response to the first switch signal;

enabling a second switch gate in response to a second switch signal to couple the second channel region to a second charge storage structure disposed in the semiconductor material layer in response to the second switch signal;

disabling the first switch gate in response to the first switch signal to decouple the first channel region from the first charge storage structure disposed in the semiconductor material layer in response to the first switch signal; and disabling the second switch gate in response to the second switch signal to decouple the second channel region from the second charge storage structure disposed in the semiconductor material layer in response to the second switch signal.

49. The method of claim 48, wherein said enabling the first shutter gate in response to the first shutter signal, said enabling the second shutter gate in response to the second shutter signal, said enabling the first switch gate in response to the first switch signal, and said enabling the second switch gate in response to the second switch signal occur during the integration period and during the readout period of the pixel.

50. The method of claim 48, wherein said enabling the first shutter gate in response to the first shutter signal, said enabling the second shutter gate in response to the second shutter signal, said disabling the first switch gate in response to the first switch signal, and said disabling the second switch gate in response to the second switch signal occur during the integration period and during the readout period of the pixel.

51. The method of claim 48, further comprising:

disabling the first shutter gate in response to the first shutter signal while enabling the first switch gate in response to the first switch signal to couple the first channel region to the first charge storage structure and transfer the charge from the first channel region to the first charge storage structure; and disabling the second shutter gate in response to the second shutter signal while enabling the second switch gate in response to the second switch signal to couple the second channel region to the second charge storage structure and transfer the charge from the second channel region to the second charge storage structure.

52. The method of claim 51, wherein said disabling the first shutter gate in response to the first shutter signal, said disabling the second shutter gate in response to the second shutter signal, said enabling the first switch gate in response to the first switch signal, and said enabling the second switch gate in response to the second switch signal occur during the integration period of the pixel.

53. The method of claim 51, wherein said enabling the first shutter gate in response to the first shutter signal and said enabling the second shutter gate in response to the second shutter signal occur during the readout period of the pixel.

54. The method of claim 53, wherein said disabling the first switch gate in response to the first switch signal and said disabling the second switch gate in response to the second switch signal occur during the readout period of the pixel.

55. The method of claim 54, further comprising pulsing a strobe signal coupled to the first and second charge storage structures to spill over charges stored in the first and second charge storage structures to the first and second floating diffusions while the first and second switch gates are disabled during the readout period of the pixel.

56. The method of claim 48, further comprising:
resetting the first floating diffusion in response to enabling a first reset transistor in response to a first reset signal; and
resetting the second floating diffusion in response to enabling a second reset transistor in response to a second reset signal,
wherein said enabling the first switch gate in response to the first switch signal and said enabling the second switch gate in response to the second switch signal occur during the readout period of the pixel after said resetting the first floating diffusion and said resetting the second floating diffusion.

57. The method of claim 56, further comprising:
reading the first and second pixel output signals after enabling the first and second switch gates;
resetting a common mode level between the first floating diffusion and a second floating diffusion in response to enabling a common mode transistor coupled between the first floating diffusion and the second floating diffusion; and
reading the first and second reset output values after resetting the common mode level between the first floating diffusion and the second floating diffusion.

58. The method of claim 45, wherein said transferring the charge from the first channel region to the first floating diffusion and said transferring the charge from the second channel region to the second floating diffusion occur during the integration period of the pixel and during the readout period of the pixel.

59. The method of claim 45, wherein said transferring the charge from the first channel region to the first floating diffusion and said transferring the charge from the second channel region to the second floating diffusion occur after the integration period of the pixel and during the readout period of the pixel.

* * * * *